(12) United States Patent
DeCamp et al.

(10) Patent No.: US 7,812,311 B2
(45) Date of Patent: Oct. 12, 2010

(54) METHOD AND APPARATUS FOR TWO-DIMENSIONAL SPECTROSCOPY

(75) Inventors: Matthew F. DeCamp, Swarthmore, PA (US); Andrei Tokmakoff, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 405 days.

(21) Appl. No.: 11/607,813

(22) Filed: Dec. 1, 2006

(65) Prior Publication Data
US 2007/0152154 A1 Jul. 5, 2007

Related U.S. Application Data

(60) Provisional application No. 60/741,711, filed on Dec. 2, 2005, provisional application No. 60/687,363, filed on Jun. 3, 2005.

(51) Int. Cl.
*G01J 5/02* (2006.01)
*H01L 25/00* (2006.01)

(52) U.S. Cl. .................. 250/339.07; 250/332

(58) Field of Classification Search ............ 250/339.01, 250/339.02, 339.03, 339.04, 339.05, 339.06, 250/339.07, 339.08, 339.09, 339.11, 339.12, 250/339.13, 339.14, 339.15, 339.1, 332, 250/504 R
See application file for complete search history.

(56) References Cited

U.S. PATENT DOCUMENTS

| | | | | |
|---|---|---|---|---|
| 3,860,344 A | * | 1/1975 | Garfunkel | .............. 356/51 |
| 4,450,356 A | * | 5/1984 | Murray et al. | ......... 250/339.11 |
| 4,980,566 A | | 12/1990 | Heilweil | |
| 5,451,785 A | * | 9/1995 | Faris | ..................... 250/330 |
| 5,912,910 A | * | 6/1999 | Sanders et al. | ................ 372/22 |

(Continued)

FOREIGN PATENT DOCUMENTS

DE 199 00 308 7/2000

(Continued)

OTHER PUBLICATIONS

Khalil et al, Coherent 2DIR Spectroscopy: Molecular Structure and Dynamics in Solution, J. Phys. Chem. A 2003, 107, 52-58-5279.

(Continued)

*Primary Examiner*—David P Porta
*Assistant Examiner*—Faye Boosalis
(74) *Attorney, Agent, or Firm*—Weingarten, Schurgin, Gagnebin & Lebovici LLP

(57) ABSTRACT

Preferred embodiments of the invention provide for methods and systems of 2D spectroscopy using ultrafast, first light and second light beams and a CCD array detector. A cylindrically-focused second light beam interrogates a target that is optically interactive with a frequency-dispersed excitation (first light) pulse, whereupon the second light beam is frequency-dispersed at right angle orientation to its line of focus, so that the horizontal dimension encodes the spatial location of the second light pulse and the first light frequency, while the vertical dimension encodes the second light frequency. Differential spectra of the first and second light pulses result in a 2D frequency-frequency surface equivalent to double-resonance spectroscopy. Because the first light frequency is spatially encoded in the sample, an entire surface can be acquired in a single interaction of the first and second light pulses.

59 Claims, 13 Drawing Sheets

U.S. PATENT DOCUMENTS

| | | | | |
|---|---|---|---|---|
| 6,347,014 | B1* | 2/2002 | Hayashi et al. | 359/634 |
| 7,256,885 | B2* | 8/2007 | Silberberg et al. | 356/301 |
| 2004/0195511 | A1* | 10/2004 | Elmore et al. | 250/339.02 |
| 2005/0018187 | A1* | 1/2005 | Slutter et al. | 356/328 |
| 2006/0033923 | A1* | 2/2006 | Hirasawa et al. | 356/450 |

FOREIGN PATENT DOCUMENTS

JP        10148856 A * 6/1998

OTHER PUBLICATIONS

Brixner et al, Tunable two-dimensional femtosecond spectroscopy, Optics Letters, vol. 29, No. 8, Apr. 15, 2004.

Bredenbeck et al, Transient 2D IR Spectroscopy: Snapshots of the nonequilibrium ensemble during the picosecond conformational transition of small peptide, J. Phys. Chem. B 2003, 107, 8654-8660.

Heilweil et al, Femtosecond broadband infrared dual-beam spectroscopy of metal carbonyl photochemistry, SPIE. vol. 2138.

Cervetto et al, Double resonance versus pulsed fourier transform two dimensional infrared spectroscopy: an experimental and theoretical comparison, Journal of Chemical Physics, vol. 121, No. 12, Sep. 22, 2004.

Decamp et al, Single shot two dimensional infrared spectroscopy, Chemistry Dept, MA Institute of Technology.

Jonas, Two dimensional femtosecond spectroscopy, Annu. Rev. Phys. Chem. 2003, 54:425-63.

* cited by examiner

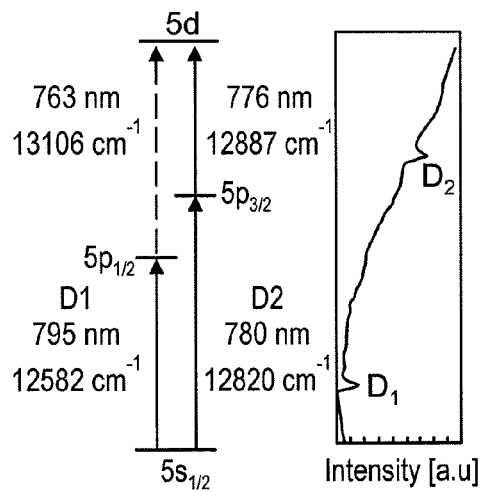
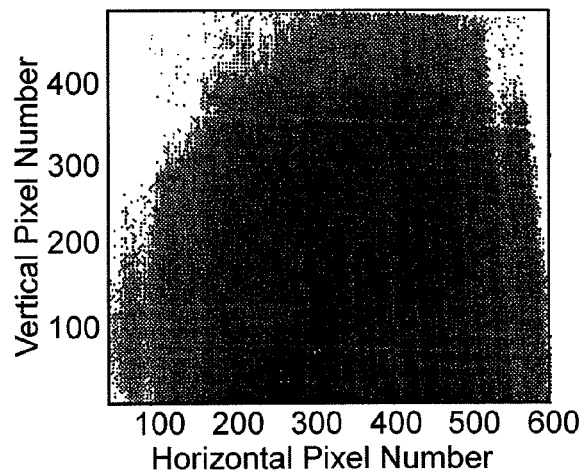
FIG. 5(a)   FIG. 5(b)
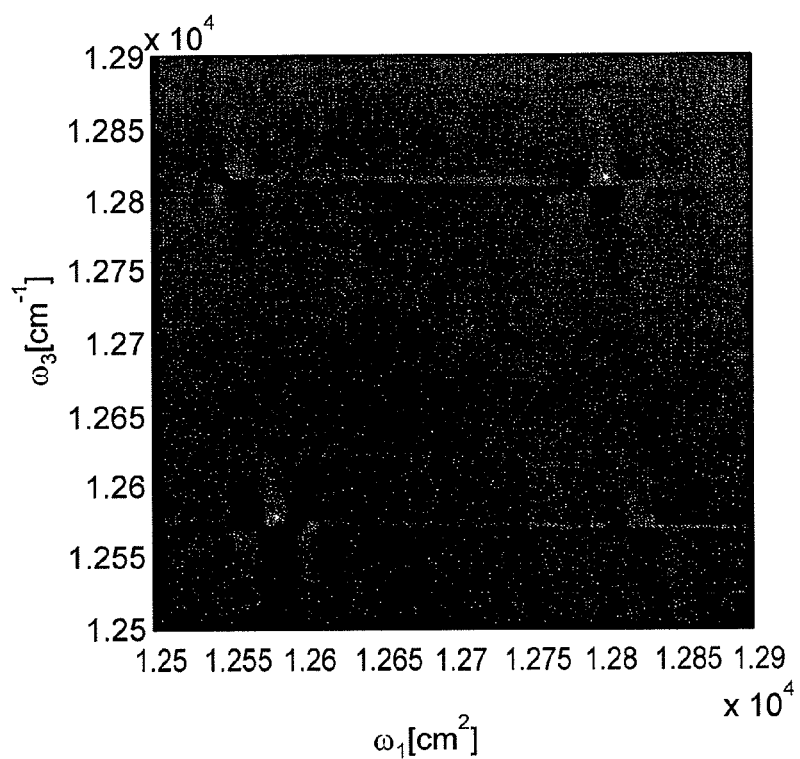
FIG. 5(c)

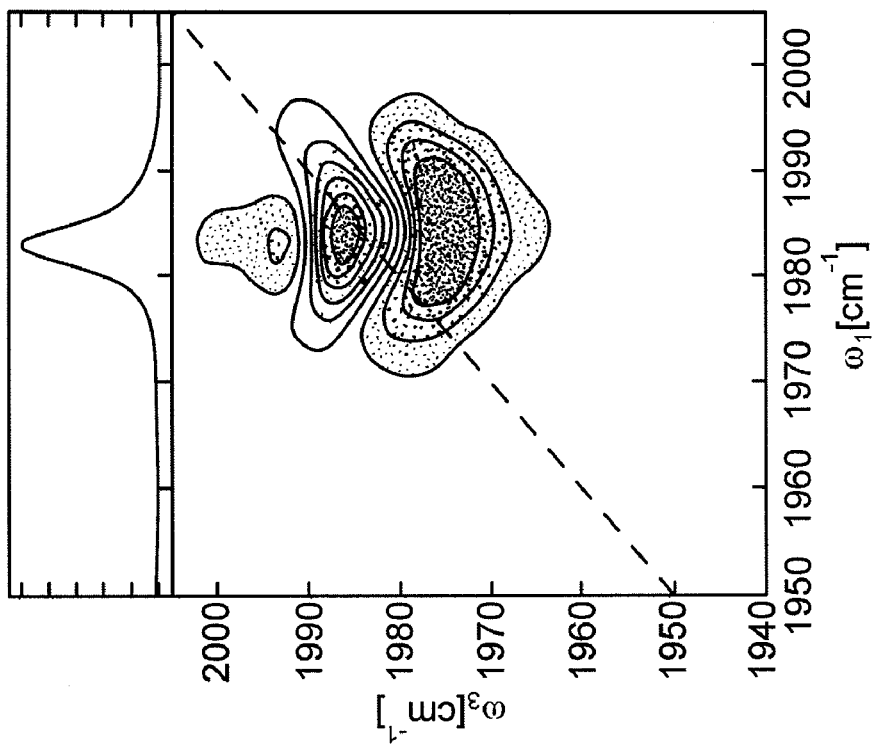
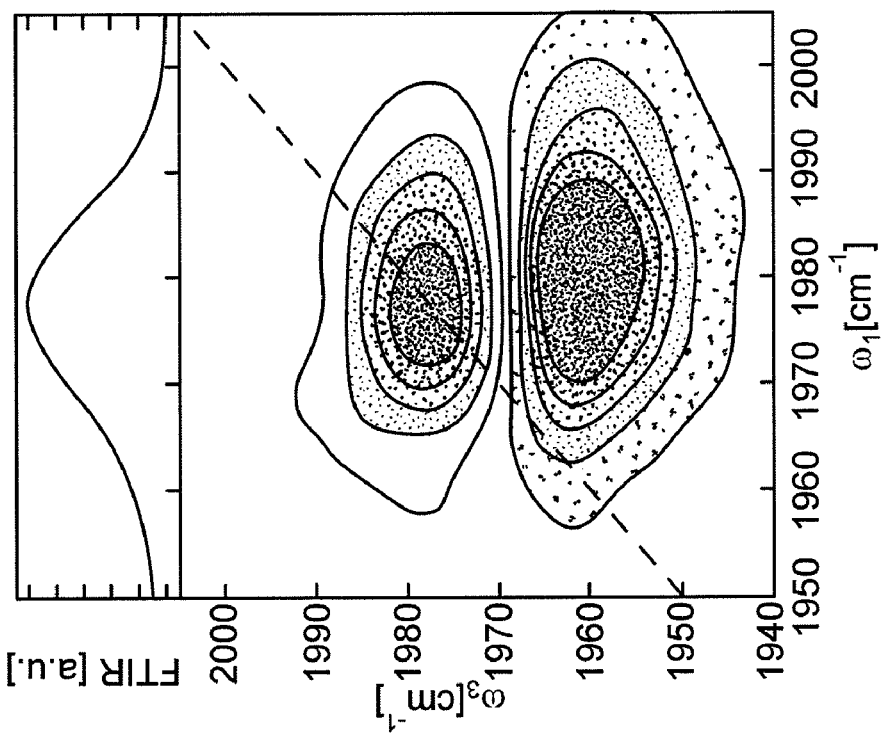
FIG. 10B
FIG. 10A

METHOD AND APPARATUS FOR TWO-DIMENSIONAL SPECTROSCOPY

CROSS-REFERENCES TO RELATED APPLICATIONS

The application claims priority to U.S. Provisional Patent Application Nos. 60/741,711 filed Dec. 2, 2005 and 60/687,363 filed Jun. 3, 2005 and U.S. application Ser. No. 11/446,588 filed Jun. 2, 2006, entitled "Method and Apparatus for Frequency-Converting Infrared Light," the entire contents of the above applications being incorporated herein by reference.

U.S. GOVERNMENT SUPPORT

Support from the Basic Energy Sciences of the U.S. Department of Energy (Grant# DEFG02-99ERI4988) and the National Science Foundation.

BACKGROUND OF THE INVENTION

Multi-dimensional optical and IR spectroscopy is a valuable tool for studying vibrational and electronic couplings and spectral correlations in multi-level systems.

Time-resolved, infrared (IR) spectroscopy is an important tool in physical chemistry and condensed matter physics. It is also of use in trace gas detection and atmospheric chemistry. In particular, mid-IR vibrational resonances provide a method for probing of molecular structure that can be combined with time-resolved techniques to extract information on molecular dynamics.

Owing to interest in characterizing spectroscopic transients at multiple vibrational frequencies in femtosecond IR experiments, there has been a need for multichannel IR array detectors. However, these arrays are presently limited by their finite size (typically 32 to 128 elements in linear arrays), and by their high cost. Unlike CCD arrays, traditional IR arrays are also very sensitive to thermal blackbody radiation, making thermal isolation a prerequisite for imaging. Most mid-infrared detectors must be liquid nitrogen cooled to obtain adequate sensitivity.

One of the current constraints of multi-dimensional spectroscopy is the experimental complexity of data acquisition, involving complicated pulse sequences and/or expensive spectral filters.

Multi-dimensional spectroscopy measures the total emitted field from a non-linear optical interaction in a quantum system. The complete measurement of the induced polarization has often been constructed using complex pulse sequences with multi-dimensional Fourier transform spectroscopy.

Pulsed Fourier transform spectroscopy typically uses three broadband pump pulses (focused in a non-colinear geometry) to generate a signal field in the phase-matched direction. The emitted 'echo' pulse is typically heterodyned with a fourth pulse and detected as a function of pulse separation. A multi-dimensional Fourier transform of the heterodyned field results in a frequency-frequency correlation spectrum of the transitions of interest. An alternative approach is double-resonance spectroscopy in which narrow-frequency-bandwidth excitation and detection fields are scanned.

There continues to be a need for further improvements in infrared spectroscopy to more efficiently measure structures and/or dynamics of interest.

SUMMARY OF THE INVENTION

A preferred embodiment of the invention provides a method for generating and spectrally dispersing a first light pulse (pump pulse), providing a material optically coupled to the spectrally dispersed first light pulse, generating a second light pulse (probe pulse), and coupling the second pulse onto the material with the first light pulse, then spectrally dispersing the second light pulse downbeam from the material, and detecting the second light pulse with a two dimensional array (2D) detector.

A preferred embodiment of the invention utilizes a frequency conversion process in combination with the two dimensional spectroscopic imaging system and method to provide greater spectral range of applications. This method employs a system in which light is dispersed in a first plane and subsequently dispersed in a second plane at an angle to the first plane. In a preferred embodiment, the first and second planes are orthogonal to each other to provide a two-dimensional image which is upconverted using a frequency conversion element such as a non-linear crystal. This embodiment uses nonlinear optical mixing techniques, such as sum frequency generation (SFG), to provide an efficient method of "upconverting" mid-IR radiation to the visible, allowing a silicon-based detector to become a viable alternative to standard IR detectors. The upconversion technique uses SFG between a broadband optical pulse and a narrowband IR pulse to generate an optical signal. Provided that the broadband laser intensity is constant, the SFG intensity is proportional to the narrowband IR intensity. Such upconversion methods are useful for analytical chemistry, thermal imaging, trace-gas detection, analyzing telecom spectra and ultrafast laser characterization, for example.

Upconversion of an infrared spectrum onto one dimension on an IR array and a spatial coordinate (x) in the other dimension can be used to give a linear image of a sample with chemical specificity. If this is coupled with a spatial scanning of the orthogonal dimension (y) one can extend this method to chemically sensitive imaging of a two-dimensional area of a sample region. Certain geometric configurations can encode along an axis of spectral dispersion of a first light pulse a spatial location of a probe pulse that is focused at a sample plane.

The invention provides also, in preferred embodiments, a method for generating a first light beam and spectrally dispersing the first beam horizontally, generating a second light beam that is cylindrically focused horizontally and spatially overlapped with the first beam, coupling the first and second overlapped beams onto a sample material, downbeam from the material collimating vertically the second beam and spectrally dispersing the second beam vertically, and imaging the second beam onto a 2D array detector.

Another preferred embodiment of the invention provides for detecting the second light pulse by imaging with a CCD array detector, differentially detecting an array image with and without the first light pulse and producing a 2D spectrum that correlates a frequency of the first light pulse and a frequency of the second light pulse.

A further preferred embodiment of the invention provides for coupling energy to the material with the first light pulse to excite one or more of properties, energy levels, aspects, bonds, orbitals and characteristics of the material, and coupling the material with the second light pulse at detectable frequencies such that the one or more of properties, energy levels, aspects, bonds, orbitals and characteristics of the material that have been excited by the optical interaction with the first light pulse are detected in the 2D spectrum.

Another preferred embodiment provides for collecting the second light pulse after (downbeam from) the material with a first spherical lens positioned at a distance $f_2$ from the material, wherein the first spherical lens couples the collimated second light pulse to a vertical plane and focused in a horizontal plane, placing a vertically oriented dispersing element, such as a grating, at a focal plane of the first spherical lens to produce a vertically dispersed spectrum, collecting the vertically dispersed spectrum by a second spherical lens positioned in an optical path at a distance $f_3$ from the vertically oriented grating and at an optical distance $f_2+f_3$ from the first spherical lens, and passing light from the second spherical lens into the 2D array detector.

A further preferred embodiment of the invention provides a method for encoding a spatial location of the second pulse at the material along a first axis of spectral dispersion of the first light pulse, and encoding a frequency of the second light pulse along a second axis that is orthogonal to the first axis.

One preferred embodiment of the invention provides for taking differential images, and creating a 2D spectral surface in a single interaction of the first and second light pulses.

Another embodiment provides a method for measuring correlation dynamics by delaying the second light pulse with respect to the first light pulse, the time delay being controlled by (or gated by) a computer delay stage.

A preferred embodiment provides for generating at least one of the first light pulse and the second light pulse with a pulse duration in a range between 1 femtosecond and 10 picoseconds.

A further preferred embodiment of the invention provides a method wherein a first light pulse is generated in any one of infrared range, near-infrared range, visible range, ultraviolet range, microwave range, or X-ray range.

A preferred embodiment of the invention provides for a method of detecting a spectrally dispersed mid-IR transient with a silicon CCD that detects ultrafast (femtosecond or picosecond) pulses.

A further embodiment provides for generating a first ultrafast, broadband light pulse, frequency-dispersing the first light pulse by a grating or other dispersing element, generating a second, ultrafast broadband light pulse that is coupled to a common optical path with the first pulse, both being directed into a target or sample region. The second light pulse signal is then detected by a detector, such as a charge coupled device (CCD) or complementary metal-oxide semiconductor (CMOS) or other two-dimensional imaging detector.

A preferred embodiment of the invention provides for an apparatus for spectroscopy comprising: a first light pulse source optically coupled to a material; a first spectral dispersing element optically coupled to the first light pulse; a second light pulse source optically coupled to the material; a lens that focuses the second light pulse; at least one of an additional lens and a spherical mirror optically coupled to the second light pulse; a second spectral dispersing element optically coupled to the second light source; and a two dimensional detector optically coupled to light from the material. A further preferred embodiment of the invention provides for such an apparatus wherein the second dispersing element is a grating. The grating can convert the spatial orientation of the frequency with respect to a line of focus in a range of about 80 to 100 degrees of rotation.

A further embodiment provides for the first light pulse to be in an infrared range and the second light pulse in a visible range.

More generally, the invention further provides for an enhanced method of two dimensional (2D) IR spectroscopy applicable to investigating condensed phase molecular dynamics, transient chemical structures and structural vibrations through the measurement of vibrational couplings, energy shifts, and dipole orientations.

In another preferred embodiment, a 2DIR spectrometer using upconversion IR imaging provides for the acquisition of single-shot 2DIR spectra on a localized vibrational transition.

BRIEF DESCRIPTION OF THE DRAWINGS

FIG. 5($a$) illustrates a projection of the second light spectrum with the Rubidium (Rb) absorption lines labeled, alongside the Rb energy level diagram. On the left is shown the Rb energy level diagram. The solid (dashed) lines are transitions that are within (outside) the laser bandwidth.

FIG. 5($b$) shows a 20-second image of the transmitted second light spectrum. The observed vertical striations are from the laser mode imperfections the second light beam.

FIG. 5($c$) shows the differential transmission image of Rb as correlation of frequencies, with skewed (uncorrected) frequency-frequency axes.

FIG. 6($b$) shows a differential 2D correlation spectrum with corrected axes.

FIG. 6($c$) illustrates the $D_1$ diagonal peak and square boxes represent individual pixels on the CCD camera.

FIGS. 10A and 10B illustrate spectra of tungsten hexacarbonyl (WHC) and $Rh(CO)_2C_5H_7O_2$ (RDC).

DETAILED DESCRIPTION

A preferred embodiment of the invention provides methods and systems for dispersing a vibrational or electronic spectrum over two frequency axes ($\omega_1$, $\omega_3$), in order to reveal coupling through the formation of cross-peaks and the spreading out of congested spectra.

To measure the total emitted field from a non-linear optical interaction in a quantum system, a preferred embodiment of the invention provides for using frequency-scanning, pump-probe techniques with double-resonance spectroscopy. This method can provide a complete two-dimensional (2D) spectrum to be acquired using a single pump-probe interaction.

Double-resonance spectroscopy uses a frequency-narrowed light-field to pump a sample and a broadband probe-pulse to interrogate the excited sample. Dispersing the probe field yields a standard, frequency-resolved, signal of the first and second light pulses. A series of dispersed probe spectra ($\omega_3$) taken at different pump frequencies ($\omega_1$) reveal the two-dimensional frequency-frequency correlation spectrum.

In pump-probe spectroscopy, the spectral and temporal characteristics of the pump pulse can be constant over the interaction area. However, preferred embodiments of the invention provide for a multi-dimensional spectrometer where this constraint is relaxed. The method of the present invention uses the double resonance idea, but with the bandwidth generated by short pulses and spatially dispersed to separate them.

A preferred embodiment of the invention provides for a broadband first light pulse (pump pulse) to be spectrally dispersed across the sample of interest using a dispersive optic (for example, such as a grating, diffractive optic, or prism), allowing for multiple, simultaneous, spectrally-independent excitations. Following the first light pulse, a cylindrically-focused, broadband, second light pulse (probe pulse) interrogates the entire area of the first light pulse. The second light pulse is then spectrally dispersed perpendicular to its line focus and imaged onto a 2D array detector. Differential detection of the array image with and without the first light pulse gives a frequency-resolved 2D spectrum that correlates the first light pulse and second light pulse frequencies.

Figure 1:
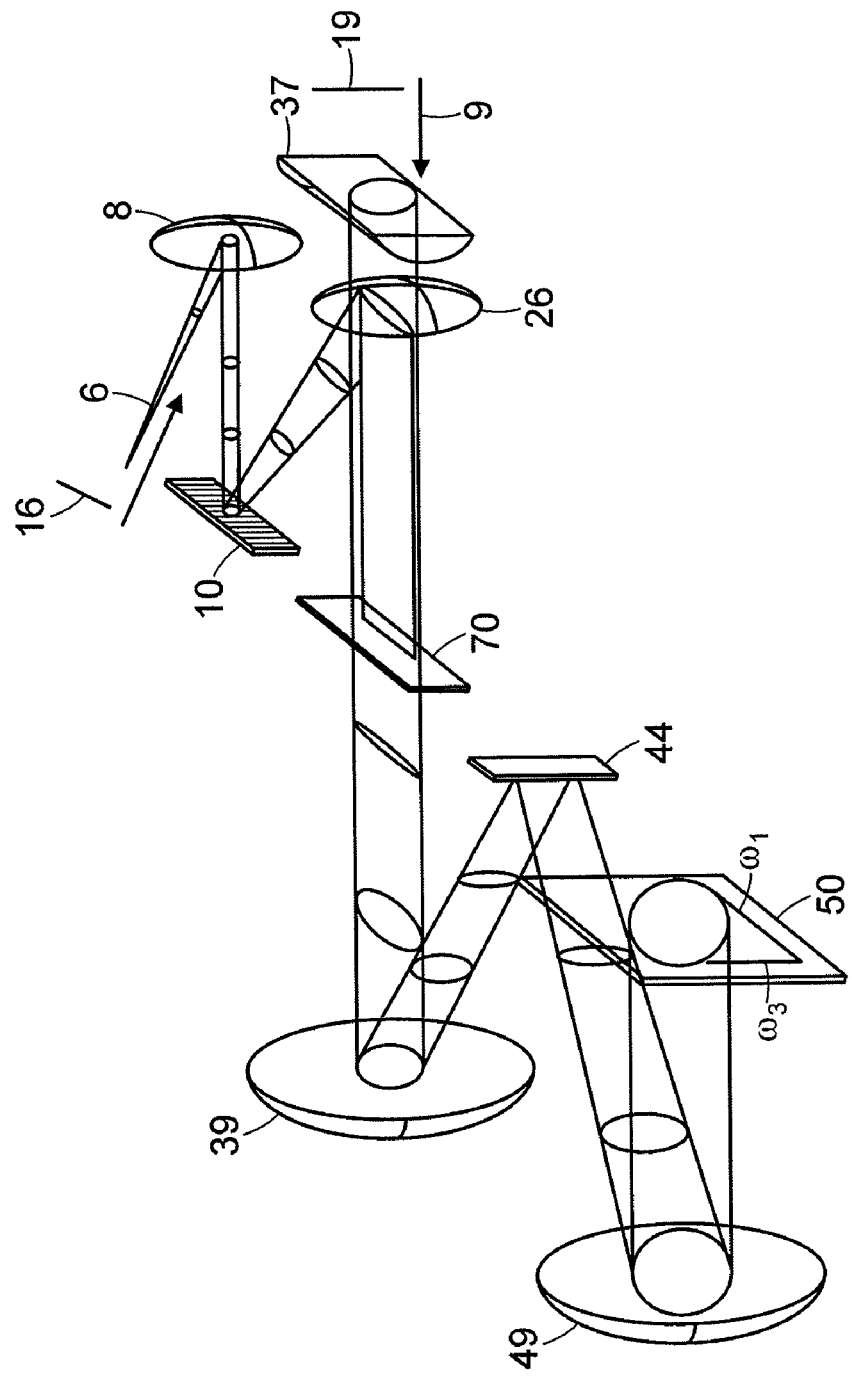
FIG. 1 illustrates a preferred embodiment of method and apparatus in accordance with the present invention.

Referring to FIG. 1, a diagram for an apparatus comprising a 2D spectrometer according to a preferred embodiment of the invention is shown. A grating spectrometer creates a frequency-dispersed first light pulse in the horizontal plane. The sample 70 is placed at the Fourier plane of the spectrometer such that every spatial position across the sample is a different frequency of the first light pulse. The temporal and frequency resolution of this spectrometer is limited only by the spectrometer optics (i.e., grating and lens).

A broadband second light pulse 9 is cylindrically-focused horizontally and spatially overlapped with the dispersed first light pulse 6. Downbeam of the material 70, the second light pulse 9 is collected with a spherical lens 39 located a distance $f_2$ from the sample. This lens causes the light to be collimated in the vertical plane and focused in the horizontal plane. A vertically oriented grating 44 is placed at the focal plane of the lens. The resultant, vertically-dispersed spectrum is collected by another spherical lens 49, located a distance $f_3$ from the grating and $f_2+f_3$ from lens 39 and imaged onto a CCD video camera array. Lenses 39 and 49 act as a telescope in the horizontal dimension, resulting in the encoding of the spatial location of the second light pulse at the sample along the horizontal axis and thus the first light pulse frequency ($\omega_1$), while the vertical dimension encodes the second light pulse frequency ($\omega_3$). Differential spectra of the first and second light pulses result in a 2D frequency-frequency surface equivalent to double-resonance spectroscopy. Because the first light pulse frequency is spatially encoded in the sample, an entire surface can be acquired in a single interaction of the first and second light pulses. To acquire 2D spectra for different 'waiting times' ($\Delta t$) the second light pulse can be delayed with respect to the first light pulse (such as by lengthening the path length), revealing the correlation dynamics.

It will be recognized by one skilled in the relevant art that the method of the present invention can be served by many optical configurations wherein the detector is at the image plane of the sample and at the focal plane of the optical element that disperses the second light beam (probe pulse) and wherein the configuration relays an image in two orthogonal directions, and that each lens shown in FIG. 1 can be replaced by a combination of many lenses and mirrors or a lens stack that plays the same role. Although embodiments described herein may refer to the dispersive optical elements for each of the first and second beams being orthogonal to one another, it will be recognized that non-orthogonal geometries can also be employed, and in some instances may be purposely used, understanding that computer processing of the acquired image signal can be used to adjust, compensate, correct, interpret, and/or otherwise make useful the acquired signal and image in manner equivalent to the embodiments described herein.

Referring still to FIG. 1, according to a preferred embodiment of the invention, the first light pulse 6 emitting from a first light pulse slit 16 can be directed by spherical mirror 8 onto a frequency-dispersing element, such as a grating 10, whereupon the frequency-dispersed first light pulse passes to an additional spherical lens 26 which directs it onto the sample material 70.

Still referring to FIG. 1, a further preferred embodiment of the invention provides an apparatus for altering an infrared light pulse, comprising a first light pulse source 6, a frequency-dispersing element 10 optically coupled to the first light pulse source 6, a grating 44, and a second light pulse source 9 emitting from a second beam slit 19 optically coupled to the grating 44 and to the first light pulse source 6, said frequency-dispersing element 10 being positioned to couple the first light pulse source 6 to the grating 44.

Again with reference to FIG. 1, a preferred embodiment of the invention includes an apparatus for 2D spectroscopy that alters an IR light pulse comprising a first light pulse source 6, a frequency-dispersing element, such as a first grating 10, optically coupled to the first light pulse source 6, a second grating 44 optically coupled to a second light pulse source 9, wherein the second grating 44 converts a spatial distribution and orientation of the frequency spectra of the second light pulse 9, for example dispersing said second pulse orthogonal to the frequency dispersion of the first light pulse 6. Said conversion of frequency characteristics of the second light pulse 9 by the second grating 44, when there is a sample material 70 placed downbeam from the first grating 10 and before the second grating 44 in the optical path common to the first and second light pulses, is sufficient to encode a spatial location of the second pulse at the material 70 along a first axis of spectral dispersion of the first light pulse and encoding a frequency of the second light pulse along a second axis that is orthogonal to the first axis.

Figure 2:
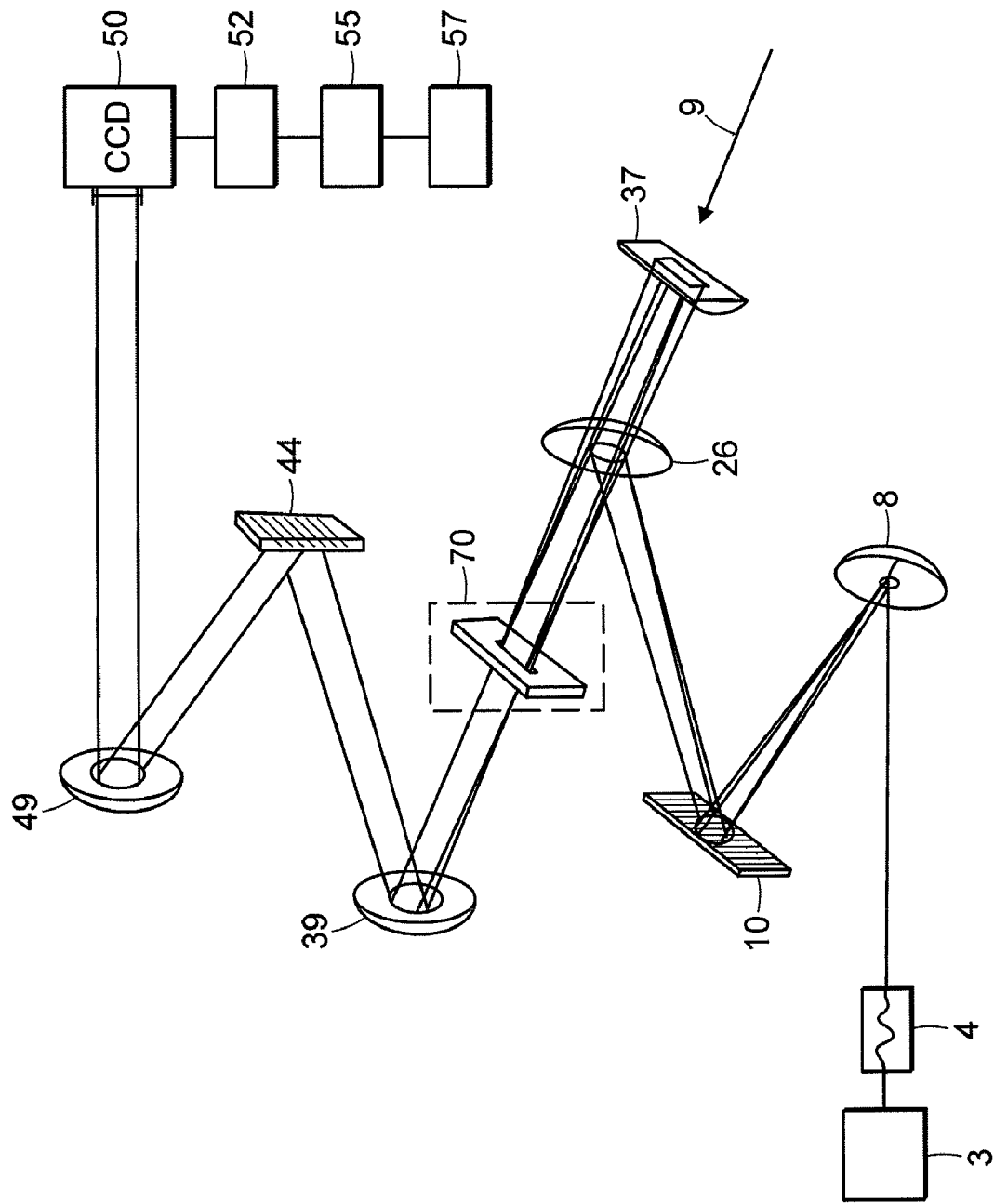
FIG. 2 illustrates another preferred embodiment of a 2D spectroscopy system in accordance with the present invention.

Referring to FIG. 2, a further preferred embodiment of the invention can include a first light source generator 3, and can include an optical parametric amplifier 4 (OPA), pumped by an IR laser, including, for example, a 150 μJ, 80 fs, 800 nm laser pulse from an amplified Ti:saphhire laser, and the spatially-dispersed form of this IR light pulse is mixed with light from a second sub-picosecond light source 9, for example with a laser pulse source.

Further embodiments provide for imaging the second light beam signal directly onto a CCD array 50, which can be a Watec LCL-902C monochrome CCD camera. The quoted sensitivity of the camera 50 is 0.01 lux and the area is 8.4

(H)×9.8(V)mm$^2$. Given the 30 fps frame rate of the camera 50, a single count on the camera corresponds to ~100 visible photons. Each video frame is captured by a video capture board computer interface 52, for example a National Instruments NI-1407 video capture board, retrieving 640 (H)×480 (V) pixels with 8-bit resolution. With the input parameters described above, the signal is easily visible to the naked eye and saturates the CCD camera 50

Also shown in FIG. 2, the invention further provides for an image processor or computer 55 configured to receive and process signals from the video capture board computer interface 52. In a preferred embodiment, a display 57 is connected to receive information from the image processor 55. Other numbered elements in FIG. 2 correspond to similarly numbered and depicted elements in FIG. 1.

It should be understood that, within the scope of the invention, each optical element in the spectrometer can be used either in transmission or reflection. Referring again to FIG. 1, for example, optical elements 8, 26, 39 and 49 can be either spherical concave mirrors or convex lenses. Optical element 37 can include a convex cylindrical lens or a concave cylindrical mirror. Optical elements 10 and 44 can be provided as a combination of gratings or prisms or other dispersive optics. Also, the material 70 can be sampled (probed) either in transmission or reflection or total internal reflection.

It will be recognized also that the combination of concave mirror/grating/concave mirror shown in FIG. 1 (i.e., the combination of optical elements 8, 10 and 26, and the combination of elements 39, 44 and 49) can each be replaced with a single diffraction grating formed on a concave substrate, referred to herein as a concave grating, such as a Concave Ruled Reflectance Grating commercially available from Newport Corporation (Irvine, Calif.). Further embodiments of the invention provide for configurations in which the some of the optics are used both for the excitation and probing. For instance, in reflection mode, optical elements 26 and 8 could also serve the additional functions of optical elements 39 and 49.

Figure 3:
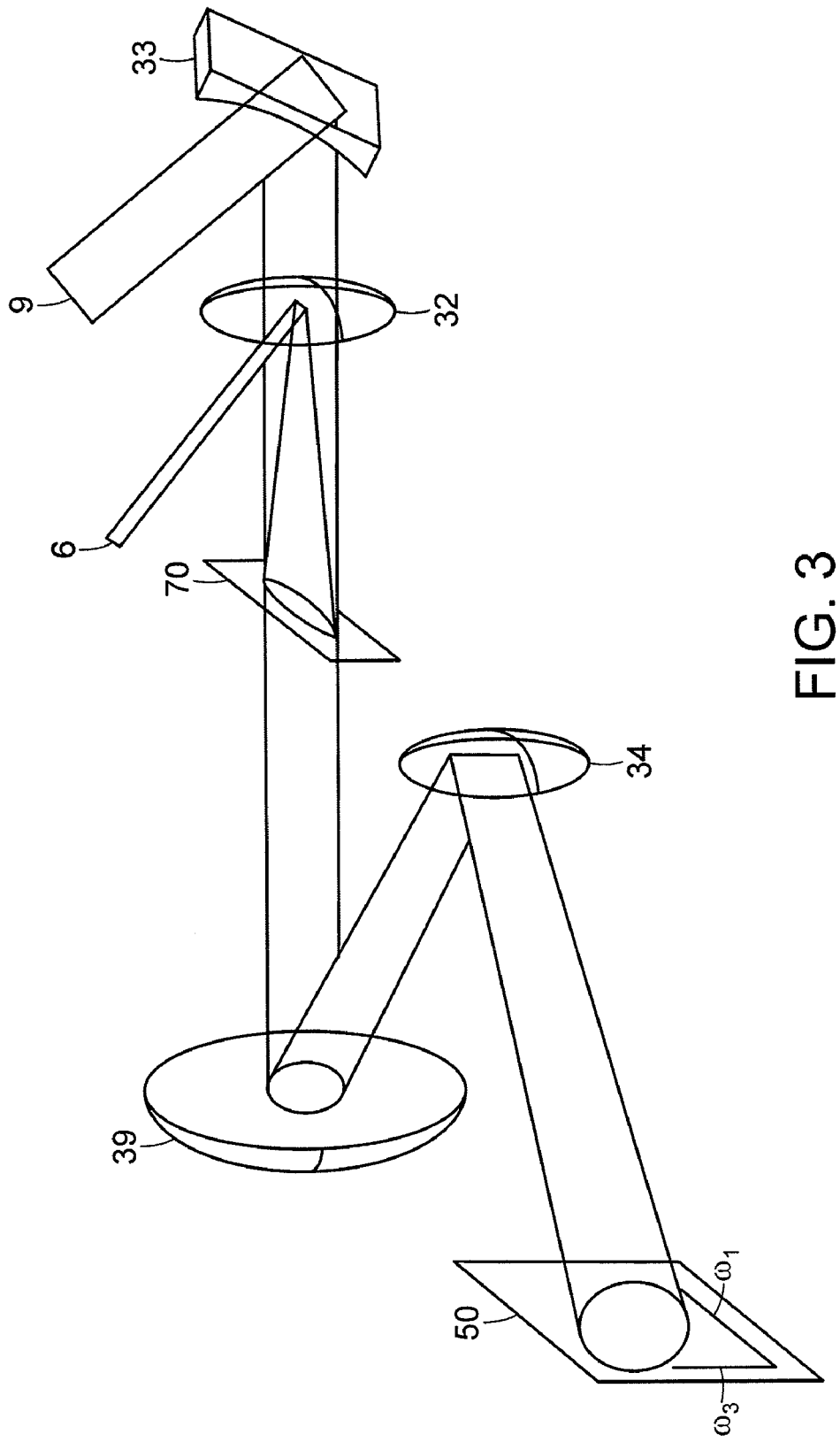
FIG. 3 illustrates an additional preferred embodiment of a 2D spectroscopy system in accordance with the present invention.

As shown in FIG. 3, an alternative preferred embodiment provides for a method and apparatus wherein there is a first light pulse 6 directed onto a concave grating 32, whereupon the first light pulse is frequency-dispersed horizontally and directed onto the sample material 70. A second light pulse 9 is cylindrically focused horizontally by projection onto and reflection from concave cylindrical mirror 33, whereupon the second light pulse beam is spatially overlapped with the dispersed first light pulse and directed onto sample material 70. Downbeam of the material 70, the second light pulse 9 is collected with a spherical lens 39, which lens causes the light to be collimated in the vertical plane. A second concave grating 34 vertically disperses the second light beam which is then imaged onto a CCD video camera array 50.

Figure 4:
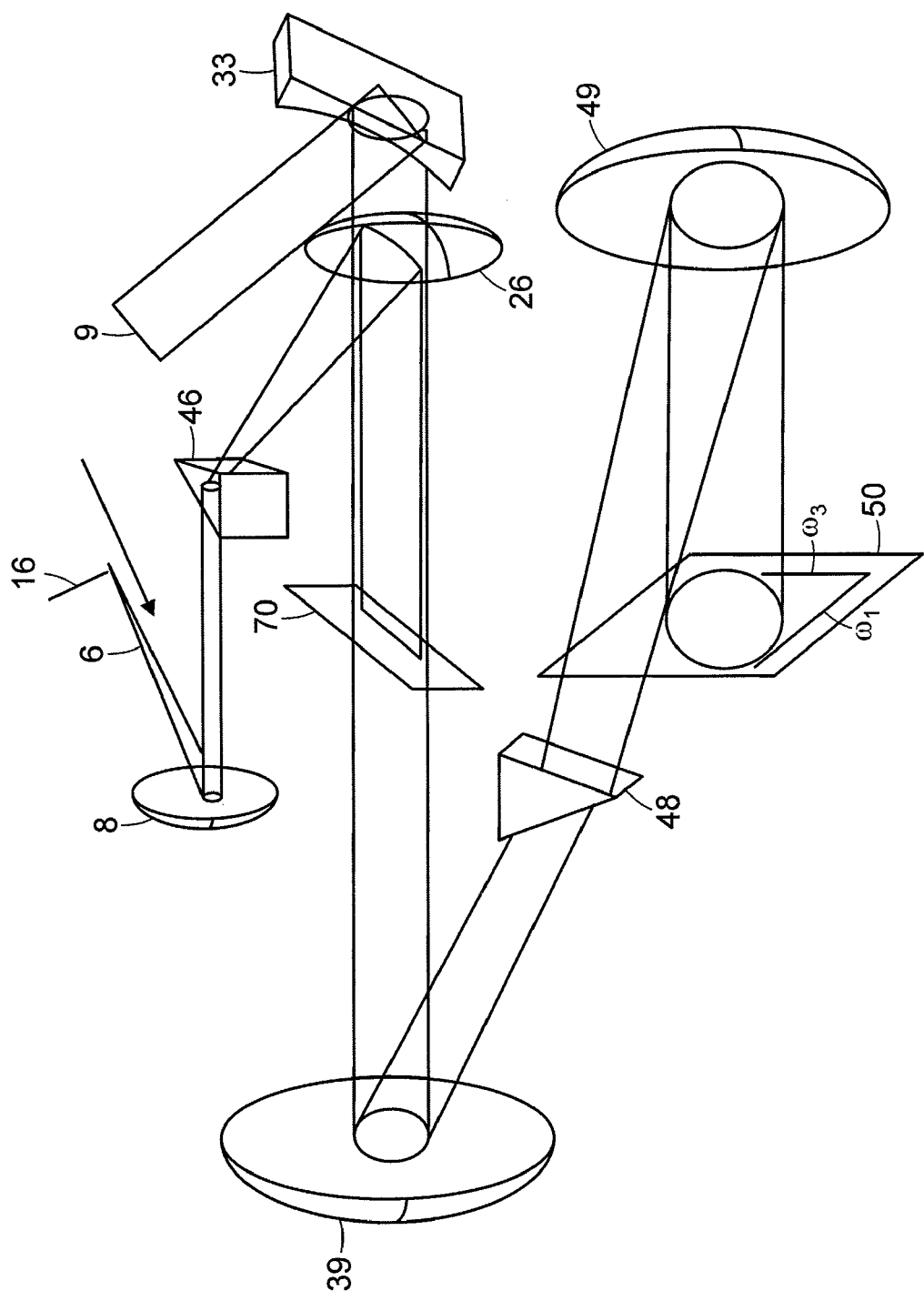
FIG. 4 illustrates yet another preferred embodiment of a 2D spectroscopy system in accordance with the present invention.

Referring now to FIG. 4, an alternative preferred embodiment provides for a method and apparatus wherein there is a first light pulse 6 emitting from a slit 16 redirected by a spherical lens 8 through a first prism 46, which prism frequency disperses the first light pulse in the horizontal plane, whereupon the frequency-dispersed first light pulse can pass to a second spherical lens 26 which redirects it onto the sample material 70. A second light pulse 9 is cylindrically focused horizontally by projection onto concave cylindrical mirror 33, whereupon the second light pulse beam is spatially overlapped with the dispersed first light pulse and directed onto sample material 70. Downbeam of the sample material 70, the second light pulse 9 is collected with a spherical lens 39, which lens causes the light to be collimated in the vertical plane. A second prism 48, vertically disperses the second light beam, which spectrally dispersed beam is collected by another spherical lens 49 and directed onto a CCD array 50.

A preferred embodiment of the invention can be further illustrated by way of an example demonstrating the use of a 2D spectrometer according to the invention to find the 2D correlation spectrum of atomic rubidium (Rb) and whereby the electronic transitions of Rb are detected (see FIG. 5(a)-(c)). A 15 mm-long Rb vapor cell, back filled with 300 Torr of He (Triad Technologies), is wrapped in a heating coil and heated to 185 degrees Celsius. In this example, the pump/probe laser is a 35 fs, 1 kHz, Ti:sapphire amplifier. An optical window is used to separate a weak second light beam pulse from a strong first light beam pulse. The time delay between both beam pulses, Δt, is controlled by a computer-controlled delay stage.

As can be understood from FIG. 2, both gratings 10,44 are 830 grooves/mm with lenses 39 and 49 each having a focal length of 250 mm. The resulting dispersed first light beam pulse has a spatial size of ~15×0.05 mm$^2$ at the target sample material 70. Temporal and spatial overlap between the spatially-dispersed first light beam pulse and the cylindrically-focused second light beam pulse is determined by second harmonic cross-correlation in a piece of β-barium borate (BBO). The resulting cross-correlation reveals a time resolution of ~4 ps (implying a first light beam frequency resolution of ~3.5 cm$^{-1}$), consistent with the theoretical resolution of the grating/lens pair.

To limit the effect of first light beam scatter caused by the Rb target sample cell, the first and second light beam pulses are cross-polarized, and a final polarizer can be used to eliminate any residual first light beam pulse prior to the beams reaching the analog video camera 50 (Watec LCL-902C monochrome CCD camera). To prevent the saturation of the camera, the second light beam pulse is attenuated by several neutral density filters, ~OD 4. Each video frame (frame rate up to 30 fps) is captured by a National Instruments NI-1407 video capture board 52, retrieving 640 (H)×480 (V) pixels with 8-bit resolution. Owing to the limited frame rate of the camera, data are taken in an 'averaged' mode, so that the CCD is used as an integrating detector. However, given the magnitude of the attenuation, single-shot measurements are possible with a triggerable digital CCD array.

A background second light pulse spectrum (i.e., with the first light beam off) possesses two strong absorption lines associated with the $D_1$ ($5S_{1/2} \rightarrow 5p_{1/2}$) and $D_2$ ($5S_{1/2} \rightarrow 5p_{3/2}$) electronic transitions of Rb. On the left in FIG. 5(a) is shown the Rb energy level diagram. The solid lines are transitions that are within the laser bandwidth, while the dashed lines are transitions that are outside the laser bandwidth. FIG. 5(b) shows a 20-second image of the transmitted second light pulse spectrum. The observed vertical striations are from the laser mode imperfections the second light beam pulse. The absorption lines are clearly visible on the camera, and provide a calibration of the $\omega_3$ axis. In the absence of strong absorption lines, the $\omega_3$ axis can be calibrated using standard optical techniques (e.g., spectral interferometry). To calibrate the $\omega_1$ axis, a ~250 micro-meter slit is placed at the focal plane of the first and second light beams. The image of the second light pulse is then compared to the spectrum of the emitted first light pulse (measured by a calibrated commercial spectrometer).

Figure 6A:
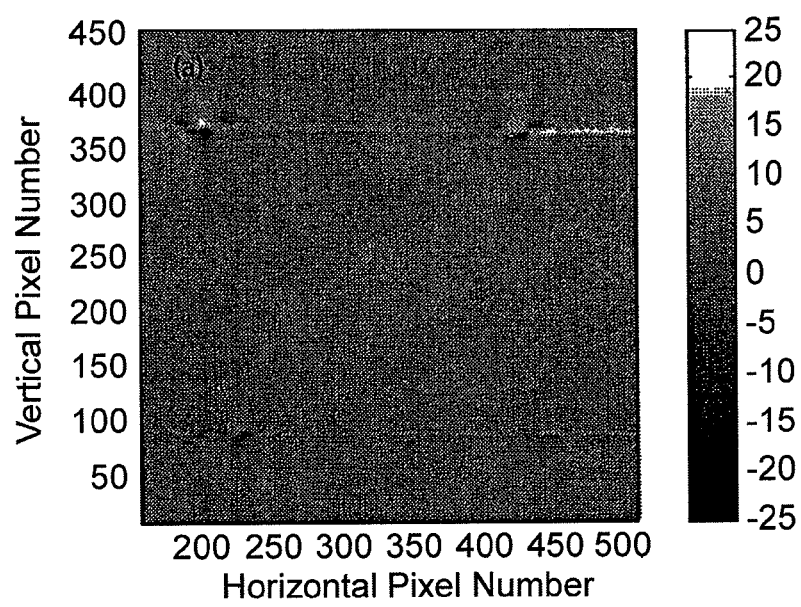
FIG. 6($a$) shows the differential transmission image of Rb with a skewed frequency axes, with axes as pixel number. The color bar (shading index) indicates percentage differential transmission.

To obtain a 2D correlation surface, differential transmission spectra between first light beam-on and first light beam-off can be taken. FIG. 6(a) shows a typical correlation spectrum, averaging 500 video frames (~20 seconds). Positive features in the correlation surface reflect stimulated emission, while negative features reflect induced bleaching. The correlation surface can be seen clearly at regular video rates, making this a "real-time", two-dimensional spectrometer.

At negative waiting times, the data do not show any change in the differential transmission. At positive waiting times ($\Delta t > 0$, see FIG. 6($b$)), a box of positive features is localized around the absorption resonances and is representative of a 2D correlation spectra between two coupled transitions ($D_1$ and $D_2$). A fifth negative peak that appears at the coordinate location ($\omega_1 = 12820$ cm$^{-1}$, $\omega_3 = 12887$ cm$^{-1}$) arises from the sequential absorption process, $5s_{1/2} \rightarrow 5p_{3/2} \rightarrow 5d$.

Figure 6B:
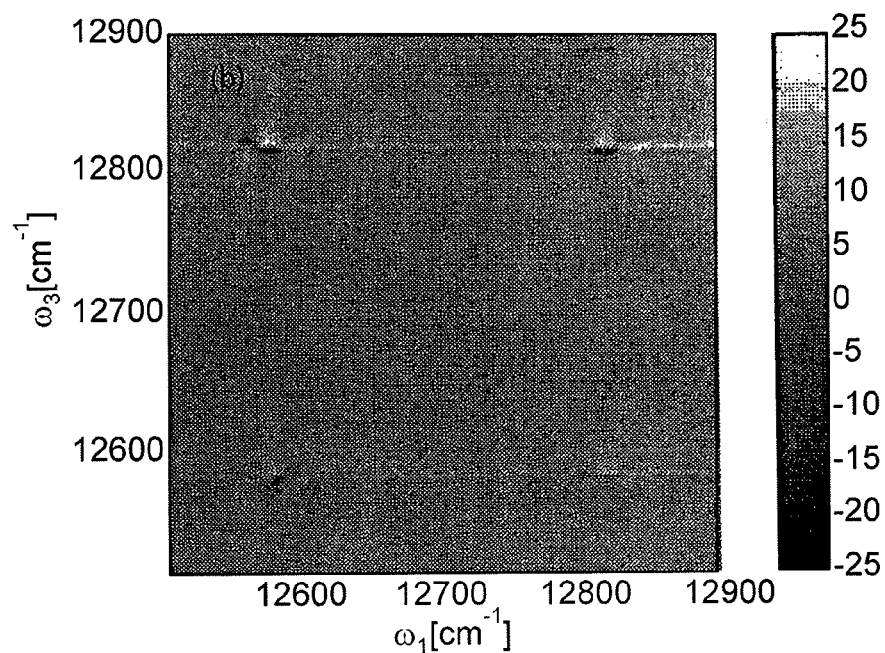
Figure 6C:
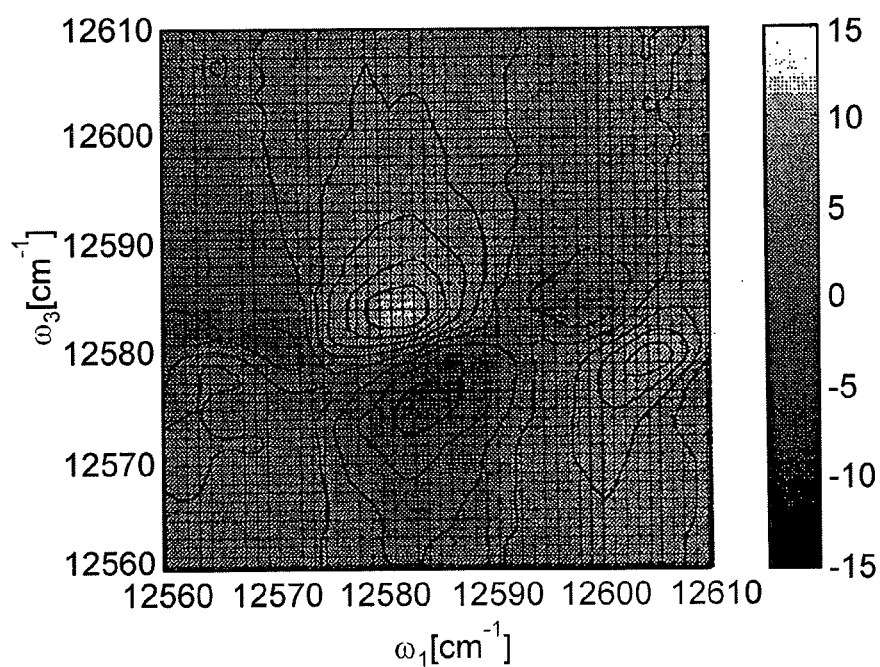

In this embodiment, for this example, owing to geometrical factors in the construction of the spectrometer, the observed angle between the cross peaks and diagonal peaks does not have to be equal to 90 degrees, leading to skewed frequency axes (see FIG. 6($a$)). As the second light pulse hits the second grating, the light is focused in the horizontal dimension. Because the grating axis in this example is not precisely perpendicular to the horizontal plane (i.e., the grating is rotated slightly about the horizontal axis) and owing to the horizontal displacement of the grating from the sample, the horizontal focusing of the second light pulse beam causes a spatial tilt on the surface of the grating. This tilt results in an apparent spatially-dependent frequency shift. This problem is eliminated either by post-processing of the 2D spectra (see FIG. 6($b$)) or by placing more precisely the second light pulse grating perpendicular to the focusing dimension.

Systematic spectral noise along the $\omega_1$ axis can arise from the spatial mode of the second light pulse beam (see FIG. 5($b$)). Ideally, the second light pulse will have a 'flat top' spatial mode, removing any artificial spectral noise in the $\omega_1$ direction. In typical operation, shot normalization will suppress most of the imperfections of the mode; however, further improvements can be implemented using simple spatial filtering techniques.

Inspection of the $D_1$ diagonal peak reveals the sensitivity of the method of this preferred embodiment at imaging complex 2D lineshapes (FIG. 6($b$)). In resolving the complex structure surrounding the absorption resonance, a projection along $\omega_1$ compares very well with traditional methods. The physical origin of this exact structure is likely related to optically dense vapors changing the spectrum of intense optical pulses near an absorption resonance, which can significantly influence the 2D spectra. This demonstration shows that the spectrometer according to this preferred embodiment can resolve 2D spectral features of ~3.5 cm$^{-1}$, i.e., the frequency resolution of the first light beam pulse.

The 2D spectrometer demonstrated according to the preferred embodiment in this case is generalizable for any standard pump-probe technique and can span any range of the electro-magnetic spectrum, from x-ray to deep infrared. For example, the introduction of polarization optics in both the first and second light beams can be utilized for multi-dimensional dichroism or birefringence measurements. The spectrometer can also be used for non-degenerate, pump-probe spectroscopy, allowing the first and second light pulses to be octaves apart (e.g., visible first light pulse, infrared second light pulse). However, the real strength of this technique arises from the ability to acquire single-shot 2D spectra, opening the door for the study of irreversible processes and non-equilibrium chemical reaction dynamics with multi-dimensional spectroscopy.

A method and apparatus of one preferred embodiment of the invention uses a narrowband infrared, second light-pulse detection and is useful for observing transient energy transfer, molecular structural rearrangement, and other chemical and physical processes. Such detection schemes can be used to obtain molecular transient absorption spectra. Enhancing methods for detecting and analyzing spectral characteristics of IR pulses is also useful for studying materials and component capabilities and signal transmission in telecommunications networks.

By imaging an infrared spectrum onto one dimension on an IR array and a spatial coordinate (x) in the other dimensions, coupled with a spatial scanning of the orthogonal dimension (y), one can extend this method to chemically sensitive imaging of a two-dimensional area. Such methods are useful for analytical chemistry, thermal imaging, trace-gas detection, analyzing telecom spectra and ultrafast laser characterization, for example.

The frequency resolution and bandwidth of this technique are only limited by the optical components, not the input laser characteristics. With simple optical components, this method can be a relatively inexpensive alternative to traditional IR array detectors.

Generally, the invention provides a method for studying properties of a target sample material 70, which is shown positioned in the optical path in FIG. 1. Here, the words "target" and/or "sample" are to be construed most broadly, to include any material, composition, mixture, compound, object, liquid, solid, gas, plasma, volume, living or non-living molecular assemblage, or any other subject matter to be studied, analyzed, monitored, investigated, or otherwise detected by the spectrometer.

By way of example and without limiting the numerous subject areas of application, embodiments of the invention can provide for detection and analysis of chemical structure, analyzing time-evolution of liquid interactions, and studying vibrational couplings from H-bonding, H—C bonding, C—O bonding and other molecular bonding interactions. Further embodiments are suitable for examining transitions in biomolecular functional groups, such as studying amide transitions in order to understand the structural basis for collective amide vibrations in model peptides and for other secondary and tertiary protein structures, or assessing or measuring structural variations in biomolecules generally, or to further describe the state of denatured proteins, or to study variations and properties within living cells.

A further embodiment of the 2D spectrometry method according to the invention provides for studying and assessing optical communication signals and the spectral characteristics of optical telecommunications transmissions and/or signals, of telecom network components, and fiberoptic materials. At telecom wavelengths, for example, there are 2D indium-antimony (InSb) detectors that can be used and at mid-IR wavelengths there are 2D mercury-cadmium-telluride (MCT) detectors that can be used. Upconversion of the detection signal can be used with a silicon detector.

Additionally, among other applications, embodiments provide for environmental monitoring and detection, remote sensing, and/or night-vision applications.

In yet another embodiment of the invention, referring again to FIG. 1, a scanning 2D spectroscopic imaging device comprises a first cylindrical objective lens 37 used to focus an IR second light pulse beam 9 to probe microscale and nanoscale sample(s) 70 and project through second lens 39 the resulting signal beam to impinge upon the array detector 50. The sample is line-imaged in the x-dimension by the cylindrical lens 37. The transmitted radiation is then collected by another cylindrical lens 39 and sent into the array detector 50. In one embodiment of this configuration, because the spectrometer includes a 2D array, one dimension of the array is wavelength, while the other dimension is the spatial x-dimension, thus obtaining spatial and spectral information simultaneously.

Regarding important scientific and commercial applications, uses of various embodiments of the invention include rapid screening or classification of chemical compounds. In contrast to linear spectroscopy, where only the constituent components are visible, a 2D spectrum can be specific to a particular molecular structure or compound. These compounds can be in gas, liquid, or solid phases. This spectrometer could be used in any sort of environment (outdoors, laboratory, or vacuum) making for a very versatile apparatus.

The 2D spectrometer according to preferred embodiments of the invention can be a stand-alone 2D spectrometer that uses an external, user-supplied laser system, and/or it can operate with a laser installed in the "box" (for example, similar to a commercial FTIR spectrometer). The only constraint on the laser is for it to be broadband (i.e., multicolor). The laser system can be solid state (e.g., a femtosecond or picosecond Ti:sapphire laser), pulsed diode laser, or fiber laser oscillator. Ultimately, the laser dictates what system the spectrometer can investigate. For example, to look for molecular signals, typically the laser is in the infrared; however, to investigate electronic signals these resonances are typically in the visible or near the ultraviolet region. For more complicated measurements, two lasers operating at two different colors can be used.

Specific components also depend on the application. For example, in applications where the sample is destroyed (an explosion or fast chemical reaction) or the laser is pulsed at a low repetition rate (<1 kHz) the CCD camera is preferably synchronized and/or gated with the laser system (a frame per laser shot). For "static" measurements (such as the rapid screening application) a variety of cameras can be used for accumulating the laser intensity. As for the computer components, an appropriate computer can download the images quickly (such as a standard Dell laptop/desktop model).

Figure 7:
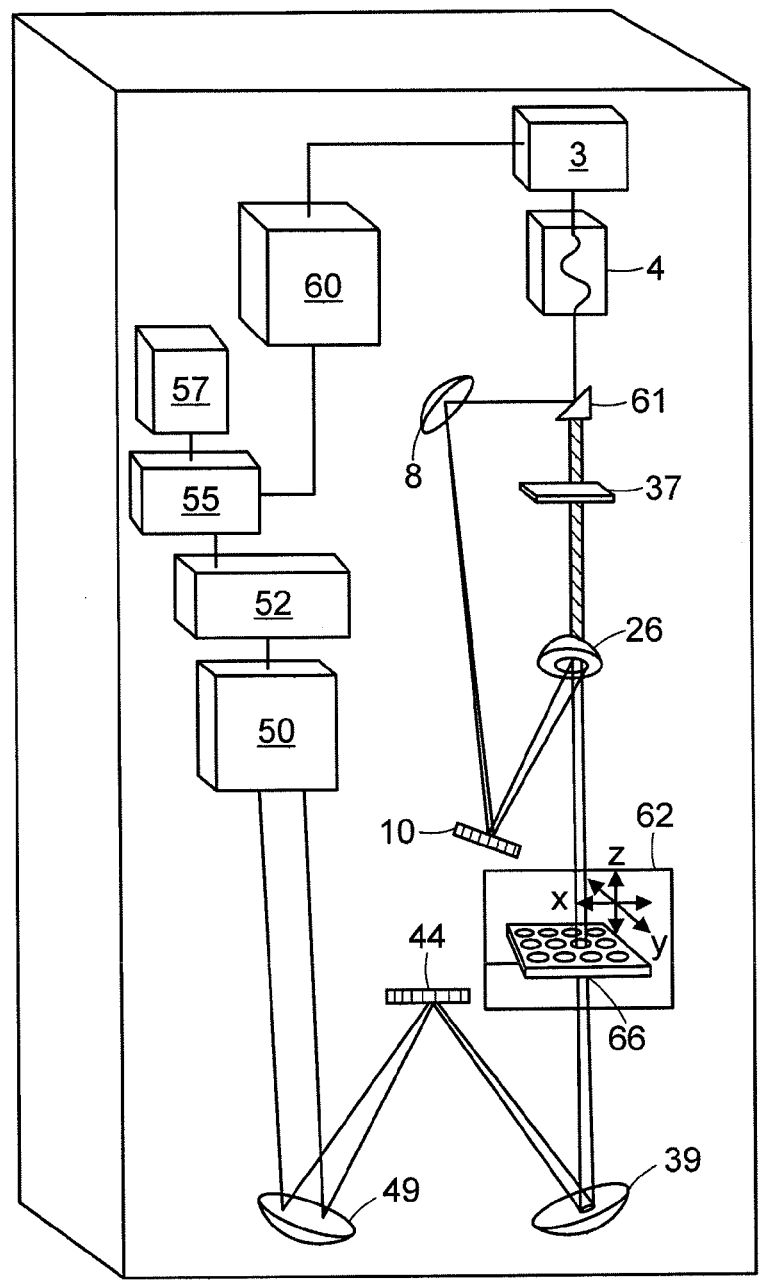
FIG. 7 illustrates an embodiment comprising a scanning 2D spectroscopic imaging device further comprising a means for analyzing multiple samples configured on a high-throughput micro-array plate.

Important applications of at least one embodiment of the invention comprising a single-shot 2D spectrometer are in high-throughput analytical chemistry and rapid screening of combinatorial libraries. For analytical chemistry applications, the methods and/or apparatus are used to rapidly analyze hundreds to thousands of samples per day for applications such as ground water or hazardous waste monitoring, food chemistry, and forensics. In the fields of materials chemistry, molecular biology or proteomics, and drug discovery, combinatorial libraries of many compounds or mutants are used in order to screen for a few samples of interest from among the library of hundreds or thousands. The method of the invention can provide a detailed and rapid way of screening such libraries; for example FIG. 7 illustrates a screening array sample plate 66 inserted in a sample chamber opening 62 of a 2D spectrometer 55, where a microcontrolling means is provided to move suitably the array sample plate 66 in the x, y and z directions to optimize focusing and to coordinate progress through multiple, sequential sample measurements. In this example, the sample material probed by the second beam can lie within a single well of the sample plate 66.

It can appreciated that the region of the sample material probed by the method and/or apparatus of the present invention can be very small. In the example shown in FIG. 7 this region can be within a single microwell of a micro-array sample plate. The size of the beam at the sample is limited only by the diffraction limit on the wavelengths used (vertical) and the amount of dispersion in the pump (horizontal), i.e., by the focusing resolution of the pump light, which is approximately wavelength by wavelength times the number of colors. Therefore, spot sizes can vary under typical conditions from (V×H) 10×300 microns in the visible to 100×3000 microns in the mid-infrared.

In the example application of the invention shown in FIG. 7, a preferred embodiment further provides an optional gating circuit 60, connecting the computer 55 with light pulse generator 3. An optional beam splitter or an uncoated optical window 61 can direct pulse source 3 to generate both first and second light pulse beams. Alternatively a separate light pulse source generator for the second light pulse can be employed. In FIG. 7, other numbered elements correspond to similarly numbered and depicted elements in FIG. 2 and descriptions of those elements are incorporated here by reference.

Embodiments of the invention further provide for using the 2D spectrometer in conjunction with an optical microscope such that the user can locate a sample of interest by eye (such as a specific biological cell) and then take a 2D spectrum of the cell. The method and/or apparatus of the invention can be implemented within a microscope in transmission or epi-detection.

Figure 8:
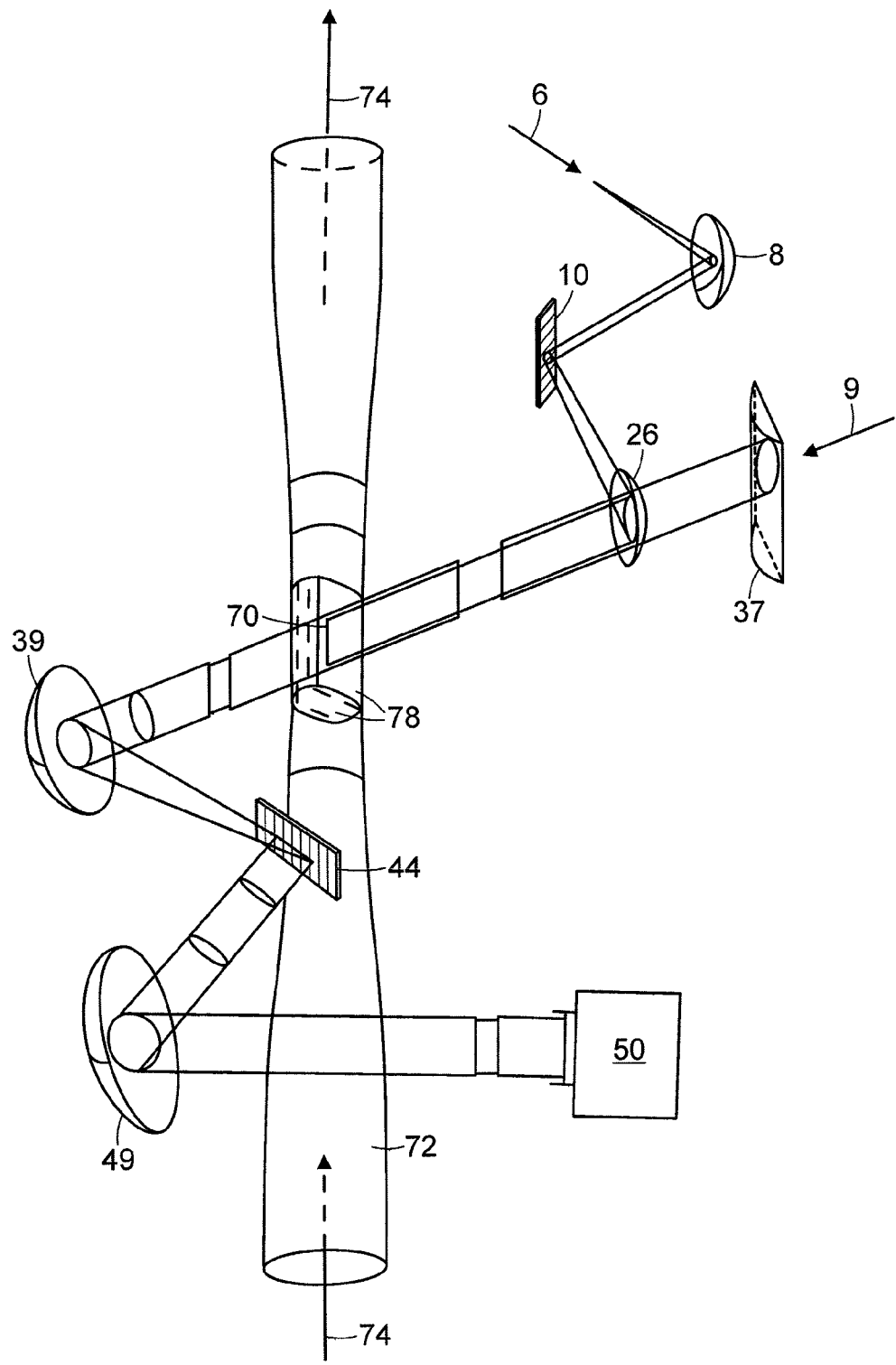
FIG. 8 illustrates an embodiment of the invention comprising a scanning 2D spectroscopic imaging device that analyzes spectral and spatial information simultaneously in real time, in a continuously flowing sample stream directed to the material focal plane.

Embodiments of the invention can also be used as a real-time, in-line probe of products in chemical synthesis, polymer synthesis, or oil refining. Referring to FIG. 8, a flow-delivery path, such as a tube or conduit 72 can deliver flowing or moving material 74 to the optical path of the spectrometer, wherein at the region intersecting the optical path at transparent wall sections 78 of the conduit 72 comprise transparent containment surfaces that present to the optical path so as to not interfere significantly with the color, intensity, wavelength, phasing, spectral spatial distribution, and/or other characteristics of the first and second light pulses impinging on the sample material 70 located between said transparent wall sections 78. In FIG. 8, the remaining numbered elements correspond to similarly numbered and depicted elements in FIG. 1 and descriptions of those elements are incorporated here by reference.

In further alternative embodiments, the optical path can be configured inside detection conduits, optionally with assisting optical elements, so that the sample material is in the optical path at a location between two windows at the end of each conduit, where the windows face each other and comprise transparent composition neutral to the optical transmission path. The material can be representative of a flow of gas, fluid, plasma, solid or mixture thereof through a containment vessel, such as a pipe, having containment wall, and/or the vessel can be a reactor or reaction chamber, a synthesis chamber, or combustion chamber, and/or a combination of such chambers, or a similar containment volume for any of a multitude of purposes in which a gas, liquid, plasma, solid or mixture thereof can be contained.

Such detection conduits described above can be on the order of many centimeters in internal diameter, width or height, for applications through the walls of pipes, reaction chambers, combustion chambers, synthesis tanks, and the like, or the probes can be miniaturized for applications in microscale containment volumes or reaction chambers, or within biological tissues or cells, or in other biological applications. Detection conduits can include fiber-optic materials also where appropriate. Further, it is in keeping with embodiments of the invention to provide a material delivery conduit that is a testing or ancillary branch, side conduit, or separated monitoring column diverted from a larger main material flow or material volume.

It will further be appreciated by one skilled in the art that the disclosed invention can be utilized with numerous FIR, NIR, IR and visible source lights as a first light pulse beam and numerous transmitted FIR, NIR, IR and visible signal beams as the second light pulse beam. Further, it will be appreciated that the disclosed methods and apparatus can be utilized in combination with additional optical detection techniques associated with tunable lasers and multi-wavelength detection, including upconversion detection, pulsed Raman spectroscopy and coherent anti-Stokes Raman spectroscopy (CARS).

The preferred embodiment employs an inexpensive 8-bit video-rate camera, but it will be appreciated that higher-end arrays with kHz data acquisition rates will dramatically improve the signal-to-noise. Further, it will be appreciated that CCDs of the "area array", "scanning linear array", and "scanning area array" type can be utilized, inter alia.

Figure 9:
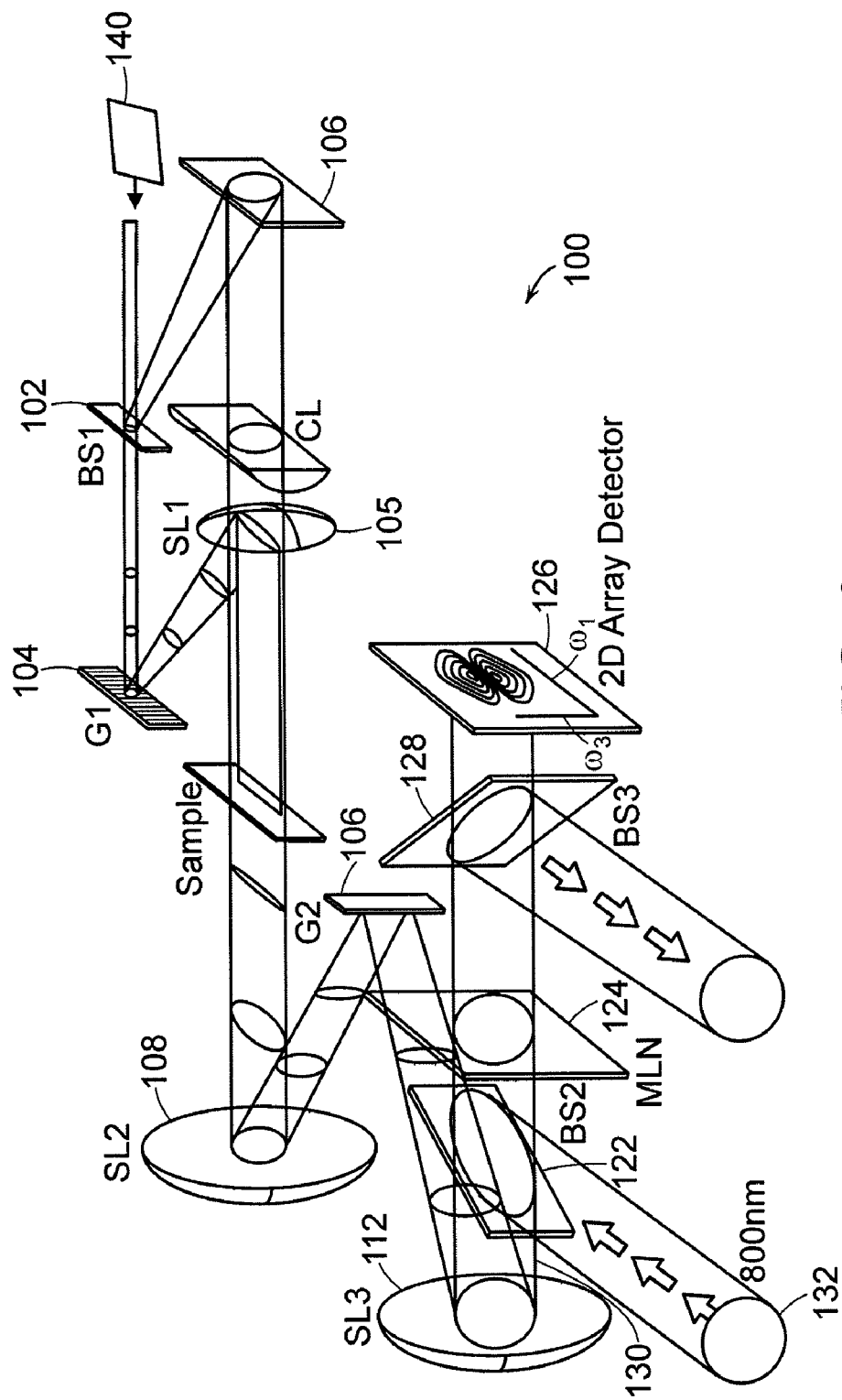
FIG. 9 illustrates a preferred embodiment of a 2DIR spectrometer.

The 2DIR spectrometer is a combination of the 2D spectrometer and an upconversion multichannel IR spectrometer (see FIG. 9). The general design of the 2D spectrometer has been discussed in detail previously herein. Further details regarding frequency conversion systems can be found in U.S. application Ser. No. 11/446,588, filed Jun. 2, 2006, the entire contents of which is incorporated herein by reference.

The present embodiment of a 2D spectrometer 100 is based upon a dispersed pump-probe setup utilizing two orthogonally oriented grating spectrometers back-to-back. The initial beamsplitter 102 (BSI) is a $CaF_2$ window coated with a dielectric 800 nm high-reflection (HR) coating. This window serves two distinct purposes: a beamsplitter for the mid-IR (reflecting ~10% of IR light for use as a probe pulse) and as a mirror for 800 nm light. Two plane ruled aluminum gratings 104, 106, blazed for 4.8 µm and with a groove spacing of $$75 \frac{\text{lines}}{\text{cm}},$$

can be used as the dispersive optic for the 2D spectrometer. The cylindrical focusing mirror 106 has a focal length of 20 cm. The first two spherical mirrors 105 and 108 (SLI and SL2) have focal lengths of 20 cm while spherical mirror 112 (SL3) has a focal length of 10 cm. This last lens effectively demagnifies the spectrum in the Fourier plane of the 2D spectrometer. With these optics, the frequency resolution of the 2D spectrometer is estimated to be ~5 $cm^{-1}$.

As in the 2D optical spectrometer, ideally a 2D array detector could be placed directly at the Fourier plane of the 2D spectrometer. While such devices are commercially available for mid-IR radiation detection, they are typically cost prohibitive for many applications. As an alternative, the IR signal is upconverted to the visible and use silicon CCD technology is used to detect the upconverted light. Prior to the upconversion crystal 120, a second 800 nm HR coating is placed on a $CaF_2$ substrate 122 (BS2) to combine the IR signal 130 with an ultrafast 800 nm laser pulse 132 for sum frequency generation (SFG). To insure that the upconverted image contains all of the spectral/spatial content of the 2D spectra, a large area $MgO:LiNbO_3$ (MLN) crystal 124 is positioned at the Fourier plane of the 2D spectrometer. The resultant upconverted field was imaged directly onto a silicon CCD array detector 126 using a single optical lens. Residual 800 nm and 400 nm (from self doubling of 800 nm) light was removed using several optical filters 128 placed prior to the CCD array (BS3). These filters remove almost 100% of the unwanted visible light while only losing ~25% of the upconverted spectra due to surface reflections and absorption. It should be noted that while the upconverted light is frequency dispersed, the functionality of 2DIR spectrometer is not effected. For this embodiment, because the upconversion is used to image the Fourier plane of the spectrometer, the spatial intensity of the upconverted light, rather than the color, dominates the upconversion process.

For the measurements described herein, a Ti:sapphire amplifier system 140 is used where the laser system produces 40 fs pulses at a 1 kHz repetition rate. 2.5 µJ, 5 µm mid-IR light was generated using an optical parametric amplifier (OPA). The generated IR pulse has a pulse length of ~80 fs with a useable bandwidth of 250 $cm^{-1}$ (FWHM). For upconversion, an uncoated 15×15×0.1 $mm^3$ MLN crystal mixed 20 µJ of 800 nm light with the mid-IR probe pulse to generate the ~700 nm visible light. The 100 µm thin crystal easily phase-matches the entire IR bandwidth for upconversion.

To increase the upconversion efficiency, the power limited 800 nm light was down collimated and provided a fluence of $$\sim 1 \frac{mJ}{cm^2}$$

at the MLN crystal surface. The upconverted light was collected by a Photometrics Cascade 128+ digital CCD camera. The CCD camera has 128×128 pixels, with a pixel size of 576 $\mu m^2$, and can be triggered at repetition rates greater than 500 Hz with 16-bit resolution. Given the observed count rate of visible photons, the conversion efficiency of the upconversion process is estimated to be ~0.1-1%. While this number is relatively small, it was limited only by the very thin upconversion crystal and the available 800 nm power.

In this example, due to the limited trigger rate on the CCD camera, the camera was synchronized to the first sub harmonic of the laser repetition rate (500 Hz). To eliminate exposure to stray visible photons and to ensure that a single laser pulse was collected by the CCD, the exposure time on the camera was set to the minimum 1 µs to isolate a single laser pulse. Differential spectra were acquired using an optical chopper, synchronized with the camera, placed in the pump arm at a chopping rate of 250 Hz. Every useable laser shot was acquired and subsequent laser shots were subtracted revealing the transient absorption spectra. To increase the signal to noise 2×2 pixel binding was used, thereby reducing the 128×128 pixel array into 64×64 pixels and increasing the effective pixel size by a factor of 4. After acquiring the signal, $10^4$ static images were collected such that differences in spectral content and upconversion signal intensity can be corrected and that acquired spectra can be normalized.

To calibrate the $\omega_3$ axis on the camera, a sample of $Rh(CO)_2C_5H_7O_2$ (RDC) is placed in hexane into the probe arm. RDC has two narrow absorption lines at 2015 $cm^{-1}$ and 2084 $cm^{-1}$ corresponding to the symmetric and antisymmetric carbonyl vibrations respectively. The narrow lines allowed the frequency calibration of the pixels in the $\omega_3$ direction and verified that the resolution of the spectrometer was ~5 $cm^{-1}$. With this embodiment of optics and CCD binding, each pixel corresponds to ~2 $cm^{-1}$ resolution. For more accurate analysis, the $\omega_3$ axis can also be calibrated by spectral interferometry.

To determine temporal and spatial overlap between the pump and probe beams, $\Delta\tau=0$, a 800 nm HR dielectric coating on BSI is utilized. Prior to the spectrometer, the 800 nm and the IR pulses are overlapped. Placing the MLN crystal at the sample position, the existence of SFG at the MLN crystal verifies the temporal and spatial overlap of the 800 nm and IR pulses. Provided that all the optics in the probe arm are reflective, this is an efficient method of determining both spatial and temporal overlap of the pump and probe arms of the 2D spectrometer. The SFG method also serves as an independent verification of the $\omega_1$ spectral resolution via the time-inverse of the cross-correlation signal (~4 ps).

The resulting SFG signal was also used to simply calibrate the pump axis. Placing a dense RDC sample in the pump arm, the $\Delta\tau=0$ measurement becomes an one dimensional (1D) upconversion IR spectrometer. While this does not calibrate the $\omega_1$, axis on the camera directly, this measurement provides that the appropriate pump colors are spatially overlapped with the probe pulse. To calibrate the $\omega_1$ axis, the diffuse scattering of the pump beam from a rough $CaF_2$ window is used. At $\tau_0$, the diffuse scattering interferes with the probe pulse. Only photons that are identical in both color and location at the sample will interfere, resulting in an interference signal directly along the diagonal at the Fourier plane of the 2D spectrometer. Provided that $\omega_3$ axis is calibrated correctly, this interference provides an instant calibration of the $\omega_1$ axis. A second more rigorous method of calibration can be accomplished by placing a small spatial mask at the sample plane. Measuring the position of the transmitted probe pulse on the CCD camera and correlating that with a independent measurement of the pump frequency.

To demonstrate the functionality of the 2DIR spectrometer, the 2DIR spectrum of tungsten hexacarbonyl (WHC) and RDC is measured. To eliminate any interference effects between pump and probe beams from diffuse scattering, the spectra were taken at a time delay of $\Delta\tau=40$ ps. These two systems demonstrate the two strengths of 2DIR spectroscopy: lineshape analysis and visualizing vibrational coupling.

An example of the versatility of the 2DIR spectrometer at observing complex lineshapes the 2D spectra of WHC in hexane and chloroform are measured. As shown in FIG. 10, the carbonyl stretch of WHC represents an example of a 3-level system for 2DIR spectroscopy while the two solvents represent weakly and strongly interacting solvents. The ID FTIR spectra of WHC in the two solvents demonstrates the magnitude of the solvent interactions. The carbonyl stretch of WHC in hexane is spectrally narrow (~4 $cm^{-1}$) while the corresponding spectrum in chloroform is 3 times wider and shifted to the red.

Spectra of WHC taken with the 2DIR spectrometer shows a 2D spectra of a 3-level system (FIGS. 10A and 10B). Both samples (OD ~0.5) were placed between two 1 mm $CaF_2$ windows with a 50 µm teflon spacer. $10^5$ of sets of difference spectra were averaged. To eliminate pixel to pixel variation the acquired image was convoluted with a 2D Gaussian whose width (FWHM) was 2 pixels. This width (~4 $cm^{-1}$) is smaller than the measured frequency resolution (~6.5 $cm^{-1}$), thereby preserving all spectral content. In both solvents the stimulated emission signal is seen along the diagonal. Peak differential transmission for the hexane and chloroform solutions is as high as 2.5% and 0.5%, respectively. As anticipated from the FTIR, the 2D linewidths and peak positions have shifted appropriately indicating that the 2DIR spectrometer preserves all relevant spectral content. In the off-diagonal regions the induced absorption transition is clearly seen, completing the shape of the prototypical 3-level 2D surface.

Upon closer inspection of the 2DIR spectrum of WHC, we see some differences in the 2D lineshape as a function of solvent. In contrast to the symmetric looking lineshape of the chloroform solution, the hexane sample looks distorted. In particular, the spectral node between the stimulated emission and induced absorption signals is not a flat line, rather it appears that overtone transition is interfering with the fundamental transition. Likewise, above the fundamental transition ($\omega_3>1990$ $cm^{-1}$) a small induced absorption peak is apparent. This deformation of the 2D line shape is caused by the high OD and narrow linewidth of the WHC resulting in a relative increase of the induced absorption due to the reabsorption of the stimulated emission signal. The apparent differences between solvents demonstrates the ability of the 2DIR spectrometer to measure complex 2D lineshapes required to see spectral diffusion.

Figure 11:
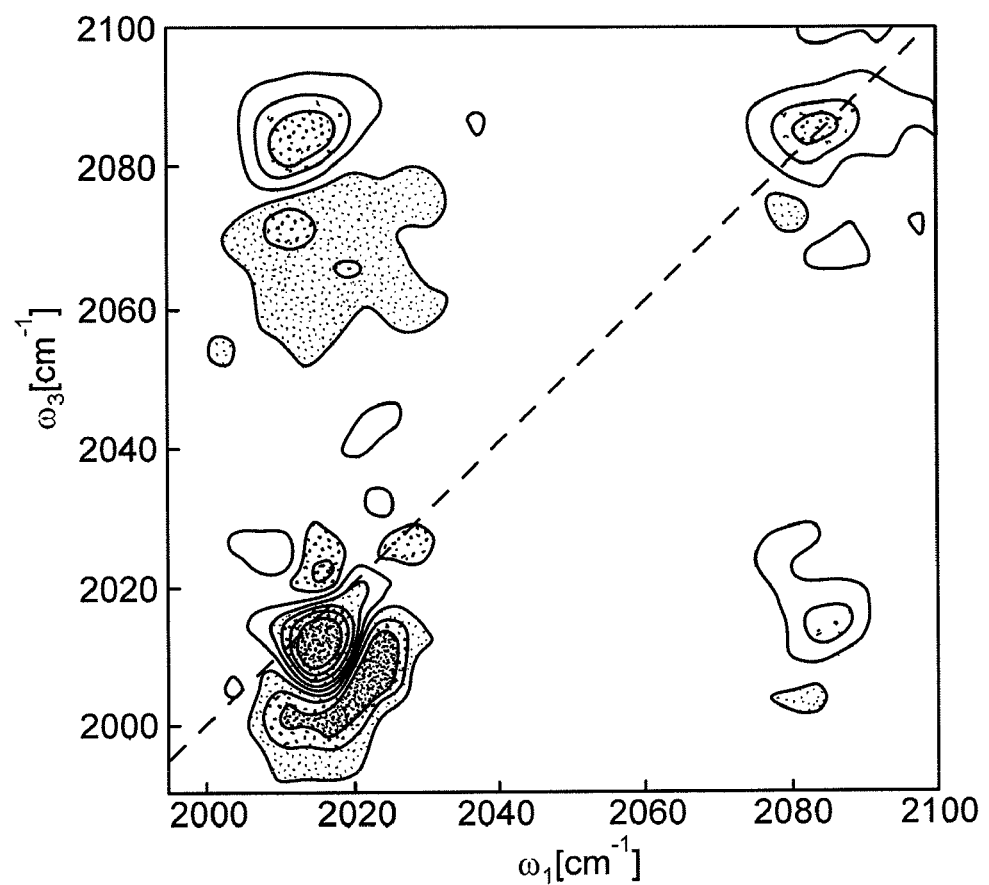
FIG. 11 are 2DIR spectra of RDC in hexane acquired by averaging a plurality of lasers shots in which each contour level corresponds to a change in transmission of 0.1 mOD.
Figure 12A:
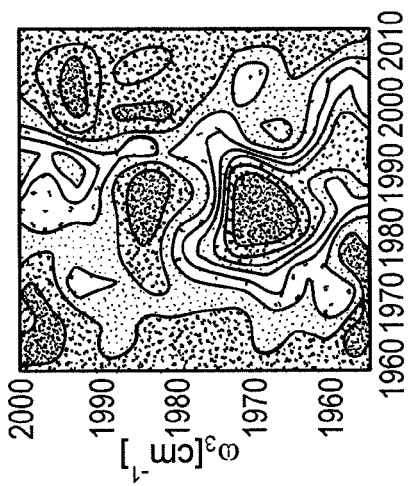
FIGS. 12A-12D illustrate a time series of 2DIR difference spectra of WHC in hexane using 1, 16, 256 an d4096 pump-probe pulses, respectively.
Figure 12B:
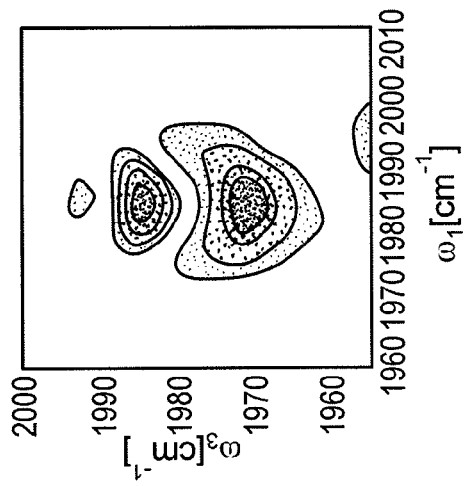
Figure 12C:
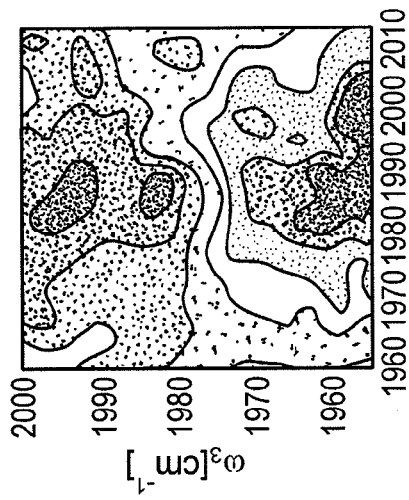
Figure 12D:
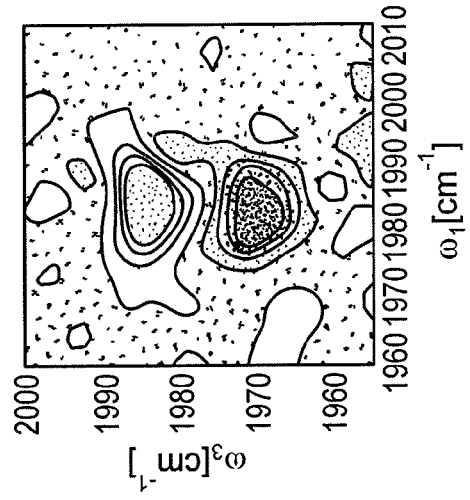

To demonstrate the measurement cross-peaks using the 2DIR spectrometer, we measure the 2DIR spectrum of RDC in hexane is measured. The symmetric and asymmetric carbonyl vibrations of RDC are anharmonically coupled. The corresponding 2DIR spectra is almost identical to that of an ideal six-level system. Unlike the relatively narrow WHC spectrum, the two transitions of RDC are dispersed across the entire CCD array, requiring a larger area of 800 nm light for the upconversion process. To overcome the limited 800 nm power, separate 2DIR spectra were taken in different CCD quadrants by moving only the position of the 800 nm beam. $10^5$ laser shots were used to acquire each 2D spectrum. The final 2D spectra was compiled by adding the individual difference spectra together (FIG. 11). This method of data acquisition effectively increases the amount of 800 nm light (and thus the upconverted intensity) without changing any of the IR optics.

The acquired 2DIR spectrum shows the characteristics of a classic six-level system, two sets of peaks along the diagonal and two sets in the off diagonal spectral regions. The peak change in transmission is $10^{-4}$-$10^{-3}$. Upon further inspection, the relative amplitudes of the peaks are not equal to the anticipated values. In particular the diagonal peaks should be approximately equal and the crosspeaks should be ~⅓ that of the diagonal peaks (assuming that the pump and probe pulses have parallel polarizations). Along each vertical stripe ($\omega_1$=constant), however, the ratio of the cross peak to the diagonal peaks are consistent with the expected value, indicating that the individual pump-probe measurements were being performed correctly.

This discrepancy is due to the finite bandwidth and spot-sizes of the pump and probe beams at the sample. For example, it is important that the sample of interest be placed directly at the Fourier plane of the first spectrometer and normal to input direction of the pump beam. Slight deviations in alignment can effect the spectral density in the pump, resulting in differences in the differential probe intensity. The spatial profile of the probe beam can also influence the final 2D spectrum through astigmatic cylindrical focusing at the sample, resulting in poor mode matching of the pump and probe beams. As seen in FIG. 11, these technical misalignments can result in the distortion of the probe intensity as a function of the pump frequency. These effects can be corrected for through careful alignment of the spectrometer and/or data post-processing.

While the 2DIR spectrometer demonstrates the ability to acquire 2D spectra quickly, the real strength is the potential of taking 2DIR spectra in a single shot. In FIGS. 12A-12D, a series of 2D spectra is shown. Each frame is the average difference spectra between 1, 16, 256, and 4096 pump-probe pairs. It is clear that in a single shot, general features of the 2D spectra are apparent, namely a positive emission peak and negative absorption peak in the correct spectral regions as well as spectral node in the correct location. By 256 averages, the general 2D lineshape is visible and by 4096 almost all of the salient features seen in FIG. 10A (distorted 2D line shape, induced absorption peak above positive) are represented in the spectra.

While the spectrometer illustrates measuring single-shot 2DIR spectra, several additional features can be included for this spectrometer to work throughout the IR spectral region. For example, analysis of the signal-to-noise ratio indicates that the upconversion 2DIR spectrometer is shot-noise limited, resulting in measuring changes as small as 0.1% in under 10 seconds with a 1 kHz laser source. In this example, the laser pulse shot-to-shot variability (~3%) limited the minimum single-shot resolution. With improved laser stability, the 16-bit camera is able to measure changes on the order of $10^{-4}$ (0.1 m OD) with a single pump-probe interaction, sufficient to measure the RDC spectrum. To measure the entire RDC spectrum in a single shot, the 800 nm power used for upconversion can be increased by an order of magnitude to cover the entire desired spectral content. Other embodiments include modifying the upconversion techniques for use in the biological 'fingerprint' region of the IR spectrum, 6-8, μm. This requires either changing the nonlinear crystal used for upconversion (which may require a upconversion laser at a wavelength other than 800 nm) or using thin MLN crystals to reduce the mid-IR absorption in the nonlinear crystal.

Preferred embodiments of the present invention utilize methods for the acquisition of 2DIR spectrum with a single laser pulse. The speed and versatility of the method allows for a large range of systems to be utilized in various applications. Single-shot data acquisition provides measuring 2DIR spectra of short lived molecular species, non-reversible chemical reactions, and relaxes equipment constraints such that low repetition rate laser systems can be used. The speed and lack of moving parts also makes the 2DIR spectrometer ideal for use in rapid screening applications, for example. This spectrometer system can be adapted to perform multi-color measurements using appropriate gratings and anisotropy measurements by incorporating polarization optics. Preferred embodiments provide a highly versatile tool for acquiring 2DIR spectra on a wide range molecular species, including biological and organic compounds.

The SFG signal is peaked at a wavelength that is the arithmetic sum of the IR frequency and the ultrafast optical pulse frequency and is only generated in locations where both the IR and visible light interact. In a preferred embodiment the SFG signal is peaked at ~655 nm. The resulting SFG signal has one spatial dimension containing the IR spectral content and another representing the focusing conditions of the incident IR beam. To ensure good SFG efficiency, the IR pulse and optical pulse must be temporally overlapped. Because the IR pulse is spectrally dispersed, the results are relatively insensitive to the relative timing between the IR pulse and the 800 nm pulse. This is one of the advantages of the invention.

The upconverted intensity is proportional to the product of the IR and visible pulse intensities. However, it is most preferable that the optical beam have a flat spatial profile across the crystal ($KNbO_3$ or $MgO:LiNbO_3$ to ensure a flat spectral response for the IR pulse. The thickness of the nonlinear crystal will also limit the bandwidth (not resolution) that can be up-converted on a single shot. For example, IR bandwidths larger than 100 $cm^{-1}$ can require crystal thicknesses less than 300 μm.

During a calibration procedure to characterize the spectrometer, the source may be a spectral interferometer. In the preferred embodiment calibration of the spectrometer is performed using a Michaelson interferometer to generate two identical IR pulses. The time delay between the two pulses is controlled by a calibrated motorized delay line. The pulse train is sent into the SFG spectrometer and the resulting spectra are recorded as a function of pulse separation. The temporal interferogram of each CCD pixel is Fourier transformed, resulting in the frequency calibration for each pixel.

By way of example and without limiting the numerous subject areas of application, such detection includes such subjects as:

time evolution of liquid interactions;

vibrational couplings from H-bonding, H—C bonding, C—O bonding and other molecular bonding interactions;

amide transitions to understand the structural basis for collective amide vibrations in model peptides and for other secondary and tertiary protein structures;

structural variations in biomolecules, in order to further describe the state of denatured proteins, or within living cells;

optical communication signals and the spectral characteristics of optical telecommunications transmissions and/or signals, of telecom network components, and fiberoptic materials; and, inter alia, environmental monitoring and detection, remote sensing, and/or subjects of night-vision applications.

The invention can be applied in time-resolved mode with sequential IR pulses focused into the sample in specific geometric configurations that allow the detected resultant signal that radiates from the sample to be deconvolved. For details on the related mathematical data analysis see Fecko et al., *Science*, 301/5640, 1698-1702; the cited reference being herein fully incorporated by reference.

It will further be appreciated by one skilled in the art that the disclosed invention can be utilized with numerous IR source lights and transmitted IR signal beams. Further, it will be appreciated that the disclosed methods and apparatus can be utilized in combination with additional optical detection techniques associated with tunable lasers and multi-wavelength detection, including pulsed Raman spectroscopy and coherent anti-Stokes Raman spectroscopy (CARS).

In one embodiment of the upconversion method according to the invention, a Ti:Sapphire pulse is used for the primary IR pulse beam. In this configuration any one of a group of standard nonlinear crystals (e.g., KNbO3, LiNbO3, and BBO) can be used to up convert 1.0-5.5 μm radiation. Upconversion of longer wavelengths can be accomplished with other crystals (e.g., $AgGaS_2$) using other ultrafast upconversion sources (e.g., near-IR OPA radiation). For instance, upconversion with the near infrared light (1.0-1.6 μm) in BBO based OPAs can be used to upconvert mid- to far-IR light into the near infrared and then detect either with Si or InGaAs based arrays. With the appropriate choice of nonlinear crystals and optics, this SFG technique can be implemented with any commercial IR monochrometer eliminating the need for liquid nitrogen cooled IR arrays.

Preferred embodiments of the invention described herein employ an inexpensive 8-bit video-rate camera, but it will be appreciated that higher-end arrays with kHz data acquisition rates will dramatically improve the signal-to-noise. Further, it will be appreciated that detector or CCDs of the "area array", "scanning linear array", and "scanning area array" type can be utilized, inter alia.

While the invention has been described in connection with specific methods and apparatus, those skilled in the art will recognize other equivalents to the specific embodiments herein. It is to be understood that the description is by way of example and not as a limitation to the scope of the invention and these equivalents are intended to be encompassed by the claims below and as set forth in the attached claims.

The invention claimed is:

1. A method for converting a frequency of light comprising:

frequency-dispersing a light signal in a first axial direction;

frequency-dispersing the frequency dispersed light signal in a second axial direction that is different from the first axial direction to form a two-dimensional frequency dispersed light signal;

directing the two-dimensional frequency-dispersed light signal and a second light signal such that the two-dimensional frequency dispersed light signal spatially overlaps the second light signal on a frequency conversion element to generate a frequency converted signal; and detecting a frequency converted two dimensional spectrum from the frequency conversion element with a two dimensional detector array.

2. The method of claim 1, further comprising frequency-dispersing the light signal in a first direction with a first grating.

3. The method of claim 1, further comprising detecting a frequency converted image of a material positioned to receive the frequency dispersed light signal with the detector array.

4. The method of claim 3, further comprising:
detecting the image and generating spectral data; and
processing the spectral data with a data processor.

5. The method of claim 3, further comprising detecting the image with a charge coupled device (CCD).

6. The method of claim 3, further comprising controlling a light source and the detector with an interface controller.

7. The method of claim 1, further comprising generating the second light signal with a pulse duration in the range between 1 femtosecond and 10 picoseconds.

8. The method of claim 1, further comprising generating the light signal having a frequency in an infrared range.

9. The method of claim 1, further comprising converting an infrared frequency to a higher frequency with a crystal.

10. The method of claim 9, further comprising providing a crystal having a non-linear optical response such as $KNbO_3$ or $MgO:LiNbO_3$.

11. The method of claim 1, further comprising directing a second broadband light signal onto an optical path in which the frequency conversion element is positioned.

12. The method of claim 1, further comprising directing the second light signal to the frequency conversion element with a first reflective element.

13. The method of claim 1, further comprising directing the second light pulse after the frequency conversion element from the optical path with a second reflective element.

14. The method of claim 13, further comprising filtering the frequency converted signal with a bandpass filter having a visible cutoff wavelength.

15. The method of claim 14, wherein the reflecting element has a reflective cutoff wavelength greater than the bandpass filter.

16. The method of claim 1, wherein the method further comprises providing a spectrometer and calibrating the spectrometer with an interferometer.

17. The method of claim 1, further comprising simultaneously detecting a plurality of infrared signals.

18. The method of claim 17, further comprising forming a spectroscopic image with the plurality of detected signals.

19. The method of claim 1, further comprising monitoring a chemical process.

20. The method of claim 1, further comprising monitoring an optical communication signal such as a fiber optic signal.

21. The method of claim 1, further comprising using an objective lens or cylindrical lens system to direct the first light pulse onto a material for spectroscopic imaging.

22. An apparatus for altering an infrared light pulse, comprising:
a first light source;
a first frequency-dispersing element optically coupled to the first light source that frequency disperses light in a first direction;
a second frequency-dispersing device that disperses light from the first frequency-dispersing element in a second direction;
a frequency conversion element;

a second light source optically coupled to the frequency-conversion element, with the first frequency-dispersing element being positioned relative to the second frequency dispersing device to couple frequency dispersed light to the frequency-conversion element; and a detector that detects frequency converted light from the frequency conversion element.

23. The apparatus of claim 22, wherein the first frequency-dispersing device comprises a grating.

24. The apparatus of claim 22, further comprising a detector optically coupled to the frequency conversion element.

25. The apparatus of claim 22, wherein the second light pulse source is a source for light pulses in the range between 1 femtosecond and 10 picoseconds in duration.

26. The apparatus of claim 22, wherein the first light source emits light having a frequency in an infrared range.

27. The apparatus of claim 22, wherein the frequency-conversion element is a non-linear crystal such as $KNBO_3$ or $MgO:LiNbO_3$.

28. The apparatus of claim 22, wherein the frequency-dispersing device is a prism or curved grating.

29. The apparatus of claim 22 wherein the first frequency dispersing element disperses light in a first direction such that different frequencies are spatially dispersed across different regions of a material and the second frequency dispersing element that disperses light from the material in a second direction that is different from the first direction.

30. The apparatus of claim 29 wherein the first direction is orthogonal to the second direction.

31. The apparatus of claim 29 wherein the first element is a first grating and the second element is a second grating.

32. The apparatus of claim 29 wherein the apparatus device forms a two dimensional spectroscopic image that is frequency converted and detected by a two dimensional detector array.

33. The apparatus of claim 29 wherein light from the first dispersing element is directed onto a light path have a sample to be measured, the sample interacting with the light to form a sampled light signal that is coupled to the second dispersing element to form a spectroscopic image that is.

34. The apparatus of claim 33 further comprising coupling a third non-dispersed light signal to the sample.

35. The apparatus of claim 34 wherein the third signal comprises light separated from a light beam incident on the first dispersing element with a beamsplitter.

36. The apparatus of claim 34 further comprising a lens to couple the third light signal onto the sample along the light path with light from the first dispersing elements.

37. The apparatus of claim 33 further comprising a first spherical mirror reflecting light from the sample onto the second dispersing element and a second spherical mirror reflecting light onto the frequency conversion element.

38. The apparatus of claim 22 wherein light from the frequency dispersing element directed on a second optical path that overlaps light from the second light source at the frequency conversion element.

39. The apparatus of claim 38 further comprising a first beamsplitter and a second beamsplitter coupling light from the second light source onto and away from the second optical path.

40. A method of two dimensional spectroscopic imaging comprising:
spectrally dispersing a light signal in a first direction;
optically coupling the spectrally dispersed light onto a material such that different frequencies are incident on different regions of the material;
optically coupling a second light signal onto the material;

spectrally dispersing light from the material in a second direction; and detecting a two dimensional spectroscopic image of the dispersed light from the material with a two dimensional detector array.

41. The method of claim 40 further comprising:
detecting the second light signal by imaging said signal;
differentially detecting an array image with and without the first light signal; and
producing a 2D spectrum that correlates a frequency of the first light signal and a frequency of the second light signal.

42. The method of claim 40 further comprising:
coupling energy into the material with the first light signal to excite one or more of properties, energy levels, aspects, bonds, orbitals and characteristics of the material; and
coupling the material with the second light signal at detectable frequencies such that the one or more of properties, energy levels, aspects, bonds, orbitals and characteristics of the material that have been excited by the optical interaction with the first light signal are detected in the 2D spectrum.

43. The method of claim 40, further comprising:
spectrally dispersing the first light signal in a first plane;
focusing the second light signal in the first plane;
collecting the second light signal after the material with a collimating optical element, wherein the collimating optical element couples the collimated second light signal to a second plane;
placing a grating oriented in the second plane at a focal plane of the collimating optical element to produce a dispersed spectrum;
collecting the dispersed spectrum by a second optical element; and
passing light from the second optical element into the 2D array detector.

44. The method of claim 43 further comprising:
encoding a spatial location of the second signal at the material along a first axis of spectral dispersion of the first light signal; and
encoding a frequency of the second light signal along a second axis that is orthogonal to the first axis.

45. The method of claim 40, further comprising:
taking differential images; and
creating a 2D spectral surface in a single interaction of the first and second light signals.

46. The method of claim 45 further comprising revealing correlation dynamics by delaying the second light signal with respect to the first light signal, the time delay being controlled by a computer delay stage.

47. The method of claim 40, further comprising spectrally dispersing the first light signal with a grating.

48. The method of claim 40, further comprising generating at least one of the first light signal and a second light signal with a pulse duration in a range between 1 femtosecond and 10 picoseconds.

49. The method of claim 40, further comprising generating a first light signal in any one of far-infrared range, infrared range, near-infrared range, visible range, ultraviolet range, microwave range, or X-ray range.

50. An apparatus for spectroscopy comprising:
a first light pulse source that generates a first light pulse;
a first spectral dispersing element that spatially disperses the first light pulse in a first direction to form a spatially dispersed light incident on a material;
a second light pulse source that generates a second light pulse incident on the material;
a second spectral dispersing element that spatially disperses light from the material in a second direction different from the first direction; and
a two dimensional detector that receives light from the material to detect a two dimensional spectral image.

51. The apparatus of claim 50, wherein the second dispersing element is a grating.

52. The apparatus of claim 50, wherein the second dispersing element is oriented with respect to a line of focus in a range of about 80 to 100 degrees of rotation.

53. The apparatus of claim 50, wherein the first light pulse comprises light pulses in a range between 1 femtosecond and 10 picoseconds in duration.

54. The apparatus of claim 50, wherein the first light pulse source is in an infrared range and the second light pulse is in a visible range.

55. An apparatus for 2D spectroscopy employing an altered infrared light pulse, comprising:
a first light pulse source;
a first frequency-dispersing element optically coupled to the first light pulse source;
a material positioned to receive frequency dispersed light from the first frequency dispersing element such that light of different frequencies is spatially dispersed across the material;
a second dispersing element that receives light from the material to form an image dispersed in two dimensions;
a second light pulse source optically coupled to the material and the second dispersing element; and
a two dimensional detector array that detects a spectroscopic image from the second dispersing element.

56. The apparatus of claim 55, wherein each of the first spectral dispersing element and the second spectral dispersing element is a grating, prism, curved grating, or other dispersive element.

57. The apparatus of claim 55, further comprising:
the second light pulse after transmission through the material being received by a collimating optical element positioned at a distance f2 from the material; and
the dispersed spectrum being received by a second optical element positioned in an optical path at a distance f3 from the oriented dispersing and at an optical distance f2 +f3 from the collimating optical element.

58. The apparatus of claim 55 further comprising an infrared laser source and a visible light source.

59. The apparatus of claim 55 further comprising a frequency conversion element that converts light from the second dispersing element.

* * * * *